United States Patent
Noro

(10) Patent No.: US 9,379,679 B2
(45) Date of Patent: Jun. 28, 2016

(54) SELF-OSCILLATING CLASS-D AMPLIFIER AND SELF-OSCILLATING FREQUENCY CONTROL METHOD FOR SELF-OSCILLATING CLASS-D AMPLIFIER

(71) Applicant: Yamaha Corporation, Hamamatsu-shi (JP)

(72) Inventor: Masao Noro, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 70 days.

(21) Appl. No.: 14/356,148

(22) PCT Filed: Nov. 2, 2012

(86) PCT No.: PCT/JP2012/078528
§ 371 (c)(1),
(2) Date: May 2, 2014

(87) PCT Pub. No.: WO2013/065846
PCT Pub. Date: May 10, 2013

(65) Prior Publication Data
US 2014/0354352 A1    Dec. 4, 2014

(30) Foreign Application Priority Data

Nov. 4, 2011 (JP) ................................. 2011-242040
Oct. 30, 2012 (JP) ................................. 2012-239612

(51) Int. Cl.
*H03F 3/38* (2006.01)
*H03F 3/217* (2006.01)
(Continued)

(52) U.S. Cl.
CPC .............. *H03F 3/217* (2013.01); *H03L 7/0812* (2013.01); *H03F 2200/333* (2013.01); *H03K 2005/00032* (2013.01)

(58) Field of Classification Search
CPC .............. H03F 3/38; H03F 3/217; H03F 7/00
USPC ....................................... 330/10, 251, 207 A
See application file for complete search history.

(56) References Cited

U.S. PATENT DOCUMENTS 4,882,546 A * 11/1989 Takamura .......... G11B 20/1403
329/310
5,160,896 A    11/1992 McCorkle
(Continued)

FOREIGN PATENT DOCUMENTS

CN    102195577 A    9/2011
EP    1 560 412 A1    8/2005
(Continued)

OTHER PUBLICATIONS

International Search Report mailed Dec. 4, 2012 for PCT Application No. PCT/JP2012/078528, with English translation, three pages.
(Continued)

*Primary Examiner* — Henry Choe
(74) *Attorney, Agent, or Firm* — Morrison & Foerster LLP

(57) ABSTRACT

A self-oscillation frequency varying element for varying the self-oscillation frequency of a self-oscillation loop of a self-oscillating class-D amplifier is placed in the self-oscillation loop. Frequency comparison, cycle comparison, or phase comparison is performed between a self-oscillation signal of the self-oscillating class-D amplifier or a signal corresponding to the self-oscillation signal and a reference frequency signal having a prescribed reference frequency. Alternatively, information corresponding to a frequency or a cycle of a self-oscillation signal of the self-oscillating class-D amplifier or a signal corresponding to the self-oscillation signal is compared with information corresponding to a prescribed reference frequency or reference cycle. The self-oscillation frequency varying element is controlled in accordance with a result of the comparison, whereby the frequency of the self-oscillation signal or the signal corresponding to the self-oscillation signal is caused to follow the frequency of the reference frequency signal.

10 Claims, 13 Drawing Sheets

(51) Int. Cl.
*H03L 7/081* (2006.01)
*H03K 5/00* (2006.01)

(56) References Cited

U.S. PATENT DOCUMENTS

| | | | | |
|---|---|---|---|---|
| 7,560,997 B2 * | 7/2009 | Nakamura | ................ | H03L 7/18 324/750.3 |
| 2005/0162228 A1 | 7/2005 | Putzeys | | |
| 2007/0188222 A1 | 8/2007 | Nguyen | | |
| 2008/0129377 A1 * | 6/2008 | You | ........................... | H03F 3/38 330/10 |
| 2010/0301955 A1 * | 12/2010 | Luong | .................... | H03B 19/00 331/117 FE |
| 2011/0227645 A1 | 9/2011 | Mayuzumi et al. | | |

FOREIGN PATENT DOCUMENTS

| | | |
|---|---|---|
| GB | 2 452 790 A | 3/2009 |
| JP | 52-112260 | 9/1977 |
| JP | 11-355139 A | 12/1999 |
| JP | 3366677 B2 | 11/2002 |
| JP | 2005-269580 A | 9/2005 |
| JP | 2010-258684 A | 11/2010 |
| WO | WO-03/090343 A2 | 10/2003 |

OTHER PUBLICATIONS

European Search Report mailed Mar. 3, 2015, for EP Application No. 12846367.6, five page.

Chinese Search Report dated Dec. 23, 2015, for CN Application No. 201280054073.8, with English translation, four pages.

Notification of the First Office Action dated Dec. 23, 2015, for CN Application No. 201280054073.8, with English translation, 19 pages.

* cited by examiner

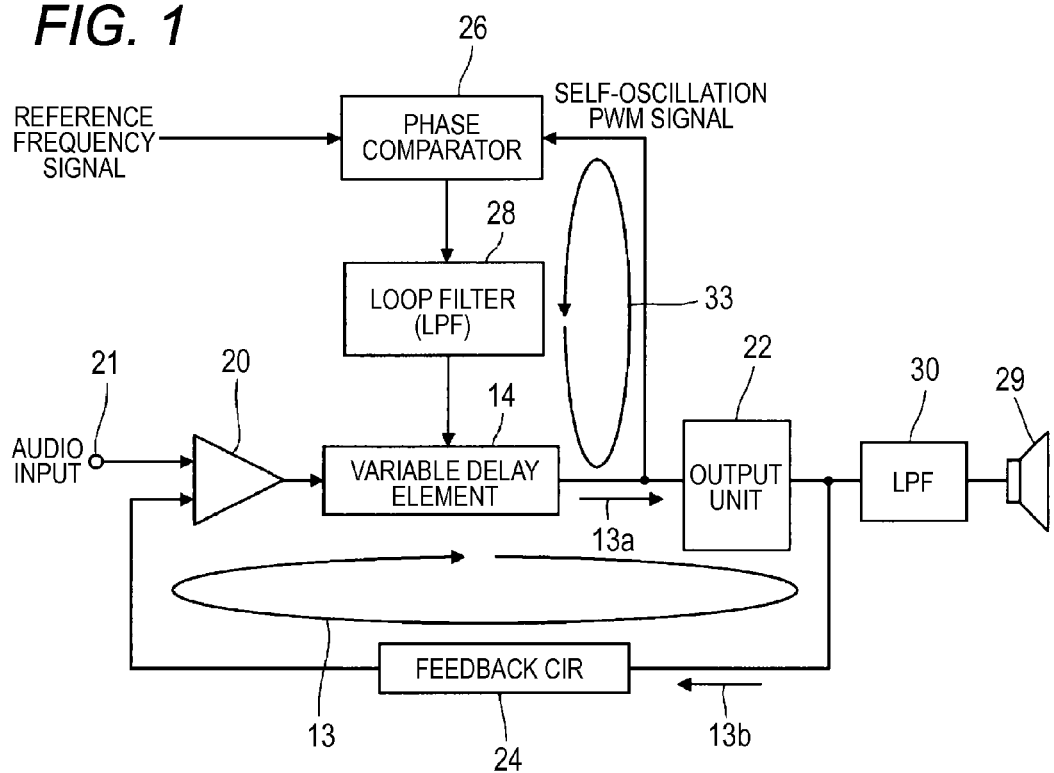
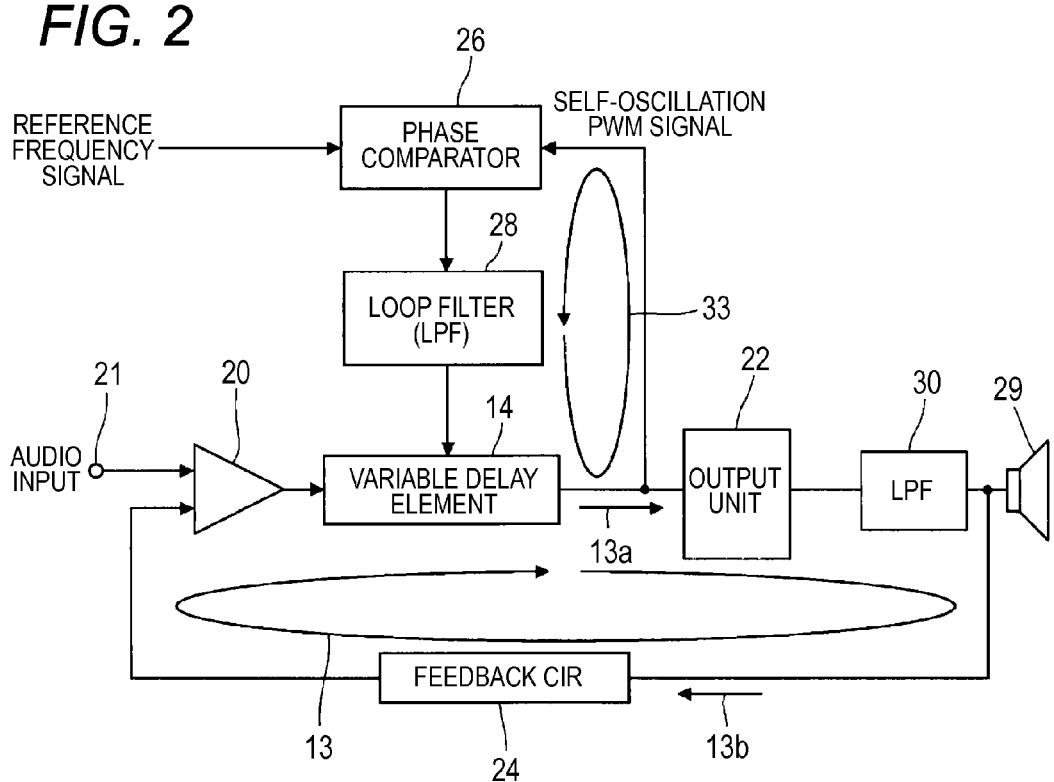

SELF-OSCILLATING CLASS-D AMPLIFIER AND SELF-OSCILLATING FREQUENCY CONTROL METHOD FOR SELF-OSCILLATING CLASS-D AMPLIFIER

CROSS-REFERENCE TO RELATED APPLICATIONS

This application is a National Phase application under 35 U.S.C. §371 of International Application No. PCT/JP2012/078528 filed Nov. 2, 2012, which claims the priority benefit of Japanese Patent Application No. 2011-242040 filed Nov. 4, 2011 and Japanese Patent Application No. 2012-239612 filed Oct. 30, 2012, the contents of which are hereby incorporated by reference in their entireties for all intended purposes.

TECHNICAL FIELD

The present invention relates to a self-oscillating class-D amplifier and a self-oscillating frequency control method for self-oscillating class-D amplifier, and intends to stabilize a self-oscillation frequency.

BACKGROUND ART

Class-D amplifiers are classified into a separately-excited oscillation type and a self-oscillation type. Self-oscillating class-D amplifiers are advantageous over separately-excited oscillation class-D amplifiers in terms of audio performance because a large feedback amount can be set in the audible frequency range. Having a self-oscillation loop, self-oscillating class-D amplifiers oscillate in a self-excited manner. Examples of the method of causing self-oscillation using a self-oscillation loop are a method in which self-oscillation is attained by causing positive feedback by rotating the phase of a feedback signal of a self-oscillation loop and a method in which self-oscillation is attained using an integration circuit which performs integration on an analog input signal and a feedback signal of a self-oscillation loop and a hysteresis comparator which receives an output signal of the integration circuit and outputs a binary signal. Among conventional techniques employing the former self-oscillation method are ones disclosed in the following Patent documents 1-3. And among conventional techniques employing the latter self-oscillation method are one disclosed in the following Patent document 4.

In self-oscillating class-D amplifiers, the oscillation frequency varies depending on the use environment (e.g., temperature variation and supply voltage variation) and due to variations with age etc. Therefore, a beat sound is prone to occur when plural self-oscillating class-D amplifiers are installed close to each other and operate simultaneously. In view of this, Patent documents 3 and 4 propose techniques for stabilizing the oscillation frequency of a self-oscillating class-D amplifier. More specifically, in the technique disclosed in Patent document 3, a signal of an external oscillator is input to a halfway point of the circuit path of a self-oscillating class-D amplifier and the oscillation frequency of the self-oscillating class-D amplifier is equalized forcibly with the frequency of the external oscillator (injection locking), whereby the oscillation frequency is stabilized. In the technique disclosed in Patent document 4, a reference voltage of a hysteresis comparator provided in a self-oscillating class-D amplifier is variably controlled so as to become equal to a voltage that is calculated using an input signal voltage value and a drive voltage value of a power amplifier, whereby the oscillation frequency is stabilized.

PRIOR ART DOCUMENTS

Patent Documents

Patent document 1: JP-A-52-112260 (FIG. 3)
Patent document 2: WO03090343 (JP-T-2005-523631)
Patent document 3: JP-A-2005-269580 (FIG. 1)
Patent document 4: Japanese Patent No. 3366677 (FIG. 2)

SUMMARY OF THE INVENTION

Problems to be Solved by the Invention

An object of the present invention is to provide a self-oscillating class-D amplifier and a self-oscillating frequency control method of a self-oscillating class-D amplifier which make it possible to stabilize a self-oscillation frequency by a different approach than the above-described conventional techniques.

Means for Solving the Problems

A self-oscillating class-D amplifier according to the invention comprises a self-oscillation frequency varying element which is placed in a self-oscillation loop of the self-oscillating class-D amplifier and varies a self-oscillation frequency of the self-oscillation loop; and a frequency control loop which extracts a self-oscillation signal of the self-oscillating class-D amplifier or a signal corresponding to the self-oscillation signal, performs frequency comparison, cycle comparison, or phase comparison between the extracted signal and a reference frequency signal having a prescribed reference frequency, and controls the self-oscillation frequency varying element in accordance with a result of the comparison and thereby performs a control of causing a frequency of the self-oscillation signal or the signal corresponding to the self-oscillation signal to follow the reference frequency (the two frequencies are not necessarily equalized completely). With this configuration, the frequency control loop is formed in which the self-oscillation loop of the self-oscillating class-D amplifier serves as a variable oscillator, whereby the frequency of a self-oscillation signal or a signal corresponding to the self-oscillation signal is caused to follow the frequency of a reference frequency signal and the oscillation frequency of the self-oscillating class-D amplifier can thereby be stabilized.

In the self-oscillating class-D amplifier according to the invention, for example, the frequency control loop may be a frequency/phase-locked loop which locks the extracted signal with the reference frequency signal in frequency and phase. With this measure, a self-oscillation signal or a signal corresponding to the self-oscillation signal can be frequency/phase-locked with a reference frequency signal. For example, the frequency/phase-locked loop may comprise a phase comparator which compares phases of the self-oscillation signal of the self-oscillating class-D amplifier or the signal corresponding to the self-oscillation signal and the reference frequency signal, and outputs a pulse signal having a duty ratio corresponding to a result of the comparison; and a loop filter which smoothes the pulse signal that is output from the phase comparator and controls the self-oscillation frequency varying element in accordance with a smoothed voltage to perform a control of frequency/phase-locking the self-oscillation signal or the signal corresponding to the self-oscillation signal with the reference frequency.

In the self-oscillating class-D amplifier according to the invention, for example, the frequency control loop may be a frequency control loop without a phase locking control.

Another self-oscillating class-D amplifier according to the invention comprises a self-oscillation frequency varying element which is placed in a self-oscillation loop of the self-oscillating class-D amplifier and varies a self-oscillation frequency of the self-oscillation loop; and a frequency control loop which extracts information corresponding to a frequency or a cycle of a self-oscillation signal of the self-oscillating class-D amplifier or a signal corresponding to the self-oscillation signal from the self-oscillation signal or the signal corresponding to the self-oscillation signal, compares the extracted information with information corresponding to a prescribed reference frequency or reference cycle, and controls the self-oscillation frequency varying element in accordance with a result of the comparison to perform a control of causing a frequency of the self-oscillation signal or the signal corresponding to the self-oscillation signal to follow the reference frequency. With this configuration, the frequency control loop is formed in which the self-oscillation loop of the self-oscillating class-D amplifier serves as a variable oscillator, whereby the frequency of a self-oscillation signal or a signal corresponding to the self-oscillation signal is caused to follow a reference frequency and the oscillation frequency of the self-oscillating class-D amplifier can thereby be stabilized. The information corresponding to the reference frequency or the reference cycle can be obtained from a reference frequency signal through a measurement or given as first-hand numerical information without using a reference frequency signal.

For example, the self-oscillating class-D amplifier may be such that it is of such a type as to oscillate in a self-excited manner through positive feedback with phase rotation of a feedback signal of the self-oscillation loop; that the self-oscillation frequency varying element is a variable delay element placed in the self-oscillation loop; and that the frequency control loop controls a delay time of the self-oscillation frequency varying element in accordance with the result of the comparison and thereby performs the control of causing the frequency of the self-oscillation signal or the signal corresponding to the self-oscillation signal to follow the reference frequency. In this case, for example, the variable delay element may have logic inverter circuits placed in a PWM signal flowing path of the self-oscillation loop, and the frequency control loop may be such as to control the delay time of the logic inverter circuits by variably controlling an operation supply voltage of the logic inverter circuits. Alternatively, the variable delay element may have a variable time constant circuit placed in the self-oscillation loop, and the frequency control loop may be such as to control the delay time of the variable time constant circuit by variably controlling the time constant of the variable time constant circuit.

For another example, the self-oscillating class-D amplifier may be such that it of such a type as to comprise an integration circuit for performing integration on an analog input signal and a feedback signal of the self-oscillation loop and a hysteresis comparator which receives an output signal of the integration circuit and outputs a binary signal, and to oscillate in a self-excited manner; that the self-oscillation frequency varying element is the hysteresis comparator; and that the frequency control loop controls a reference voltage of the hysteresis comparator in accordance with the result of the comparison and thereby performs the control of causing the frequency of the self-oscillation signal or the signal corresponding to the self-oscillation signal to follow the reference frequency.

A self-oscillating frequency control method of a self-oscillating class-D amplifier comprises the steps of varying a self-oscillation frequency of a self-oscillation loop for a self-oscillation frequency element, which is placed in the self-oscillation loop of the self-oscillating class-D amplifier; extracting a self-oscillation signal of the self-oscillating class-D amplifier or a signal corresponding to the self-oscillation signal; performing frequency comparison, cycle comparison, or phase comparison between the extracted signal and a reference frequency signal having a prescribed reference frequency; and controlling the self-oscillation frequency varying element in accordance with a result of the comparison and thereby performing a control of causing a frequency of the self-oscillation signal or the signal corresponding to the self-oscillation signal to follow the reference frequency.

Another self-oscillating frequency control method of a self-oscillating class-D amplifier comprises the steps of varying a self-oscillation frequency of a self-oscillation loop for a self-oscillation frequency varying element, which is placed in the self-oscillation loop of the self-oscillating class-D amplifier; extracting information corresponding to a frequency or a cycle of a self-oscillation signal of the self-oscillating class-D amplifier or a signal corresponding to the self-oscillation signal from the self-oscillation signal or the signal corresponding to the self-oscillation signal, comparing the extracted information with information corresponding to a prescribed reference frequency or reference cycle; and controlling the self-oscillation frequency varying element in accordance with a result of the comparison and thereby performing a control of causing a frequency of the self-oscillation signal or the signal corresponding to the self-oscillation signal to follow the reference frequency.

BRIEF DESCRIPTION OF THE DRAWINGS

FIG. 1 is a block diagram of a self-oscillating class-D amplifier according to a first embodiment of the present invention, which is a result of application of the invention to a self-oscillating class-D amplifier of such a type that self-oscillation is attained by causing positive feedback by rotating the phase of a feedback signal of a self-oscillation loop.

FIG. 2 is a block diagram of a modification that is different from the self-oscillating class-D amplifier according to the first embodiment shown in FIG. 1 in the extraction position of a feedback signal.

MODE FOR CARRYING OUT THE INVENTION

Embodiment 1

Figure 3:
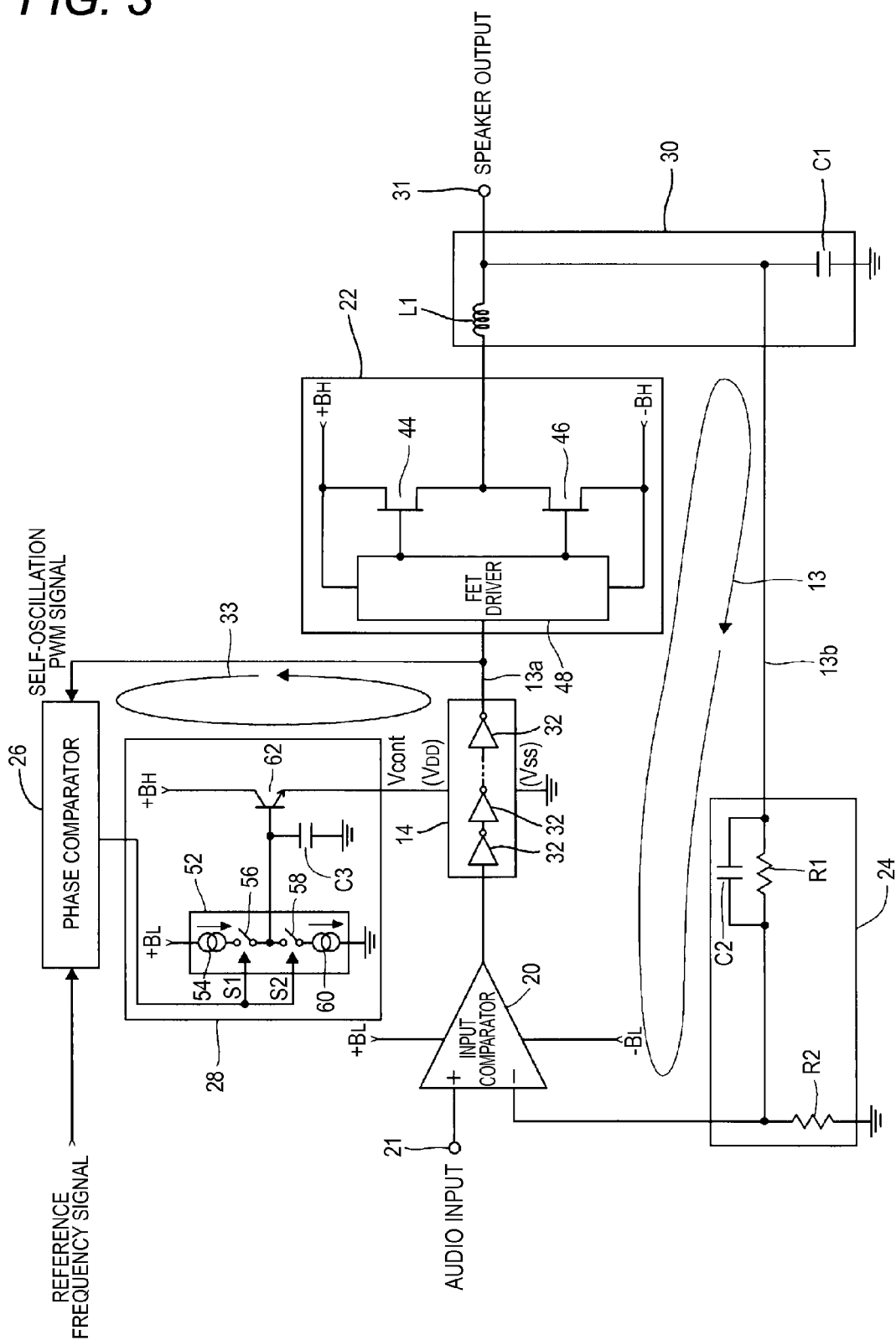
FIG. 3 is a circuit diagram of a first specific example of the modification of the first embodiment shown in FIG. 2.

FIG. 1 shows a self-oscillating class-D amplifier according to a first embodiment of the present invention. This is a result of application of the invention to a self-oscillating class-D amplifier of such a type that self-oscillation is attained by causing positive feedback by rotating the phase of a feedback signal of a self-oscillation loop. An input comparator 20 receives an analog audio input signal (received from an input terminal 21) and a feedback signal and compares the signal levels of the two signals to output a signal (a PWM signal obtained by pulse-width-modulating the analog audio input signal) whose value varies between two values "1" and "0" in accordance with the magnitudes of the two signal levels. The output signal of the input comparator 20 is supplied to an output unit 22 via a variable delay element 14 which constitutes a self-oscillation frequency varying element. Equipped with a switching element, the output unit 22 switches the switching element according to the binary signal and thereby power-amplifies and outputs the binary signal. An audio signal is extracted by a lowpass filter 30 from the PWM signal that is output from the output unit 22, and is supplied to a speaker 29, whereby a sound is emitted. The output PWM signal of the output unit 22 is fed back to the feedback input terminal of the input comparator 20 via a feedback circuit 24. A forward path 13a consisting of the input comparator 20, the variable delay element 14, and the output unit 22 and a feedback path 13b of feedback from the output unit 22 to the input comparator 20 via a feedback circuit 24 constitute a self-oscillation loop 13. Whereas the self-oscillation loop 13 serves as a negative feedback loop in the audible frequency range, it serves as a positive feedback loop at frequencies (e.g., several hundreds of kilohertz) that are sufficiently higher than the audible frequency range because of phase rotation of a feedback signal with respect to an input signal, resulting in self-oscillation. The variable delay element 14 outputs the received binary signal while varying its delay time. As the delay time of the variable delay element 14 is varied, the frequency at which the phase rotation of the feedback signal becomes equal to 180° varies and hence the self-oscillation frequency varies. Therefore, conversely, where the frequency at which the phase rotation of the feedback signal becomes equal to 180° varies naturally depending on the use environment (e.g., temperature variation or supply voltage variation) or due to variations with age or the like, the variation of the self-oscillation frequency can be suppressed by varying the delay time of the variable delay element 14 so as to cancel out the former variation.

A phase comparator 26 receives a self-oscillation signal (PWM signal) that is output from the variable delay element 14 and a clock signal (reference frequency signal) having a prescribed reference frequency (about several hundreds of kilohertz) and compares the phases of the two signals to output a pulse signal having a pulse width (duty ratio) corresponding to their phase difference (e.g., a rise time difference). A loop filter (lowpass filter) 28 averages the pulse signal that is output from the phase comparator 26 and thereby converts it into a DC signal that reflects the phase difference. The DC signal that is output from the loop filter 28 is applied to the variable delay element 14 as a control signal for control of the delay time of the variable delay element 14. More specifically, the delay time of the variable delay element 14 is shortened when the self-oscillation signal is delayed in phase from the reference frequency signal, and is elongated when the self-oscillation signal is in advance of the reference frequency signal in phase. As a result, the self-oscillation signal is locked with the reference frequency signal in frequency and phase. As such, the phase comparator 26, the loop filter 28, and the self-oscillation loop 13 constitute a frequency/phase-locked loop (PLL circuit) 33 with the self-oscillation loop 13 serving as a VCO (voltage-controlled oscillator). In this manner, the self-oscillation frequency of the self-oscillation loop 13 is stabilized with high accuracy.

The self-oscillation signal that is input to the phase comparator 26 may be the self-oscillation signal that is output from the output unit 22 instead of the self-oscillation signal that is output from the variable delay element 14. Instead of the PWM self-oscillation signal itself, a pulse signal that is synchronized with the PWM self-oscillation signal and has a constant duty ratio may be generated and input to the phase comparator 26. For example, such a pulse signal having a constant duty ratio can be generated by dividing the frequency of the PWM self-oscillation signal by a proper number (e.g., 2). In this case, the self-oscillation frequency can be controlled to a target frequency by setting the frequency of the reference frequency signal at a value obtained by dividing the self-oscillation target frequency by the frequency division ratio. Alternatively, a PLL circuit may be newly provided which compares the phases of the PWM self-oscillation signal and a pulse signal obtained by dividing the frequency of an output signal of a separately provided VCO and controls the oscillation frequency of the VCO so that the two pulse signals are phase-locked with each other. The pulse signal obtained by dividing the frequency of the output signal of the VCO can be generated as a pulse signal as mentioned above that has a constant duty ratio and used in place of the PWM self-oscillation signal. In these cases, a signal whose duty ratio is kept at 50% irrespective of a variation in the duty ratio of the PWM self-oscillation signal and that corresponds to (e.g., is synchronized with) the self-oscillation signal can be input to the phase comparator 26.

Modification of Embodiment 1

FIG. 2 shows a modification of the self-oscillating class-D amplifier according to the first embodiment of the invention. Whereas in the embodiment of FIG. 1 a PWM signal that is output from the output unit 22 is fed back to the feedback input terminal of the comparator 20 via the feedback circuit 24, a signal in the audible frequency range extracted by causing the PWM signal to pass through the lowpass filter 30 is fed back to the feedback input terminal of the input comparator 20 via the feedback circuit 24. Components having corresponding ones in FIG. 1 are given the same symbols as the latter and descriptions therefor will be omitted. According to this modification, since the lowpass filter 30 is included in the self-oscillation loop 13, the nonlinear characteristic of the lowpass filter 30 is involved in the negative feedback, whereby the distortion characteristic is improved. Although in FIGS. 1 and 2 the variable delay element 14 is placed in the forward path 13a of the self-oscillation loop 13, it may be placed in the feedback loop 13b (refer to a variable delay element/feedback circuit 66 shown in FIG. 12 (described later)).

Specific Example 1 of Modification of Embodiment 1

Figure 4:
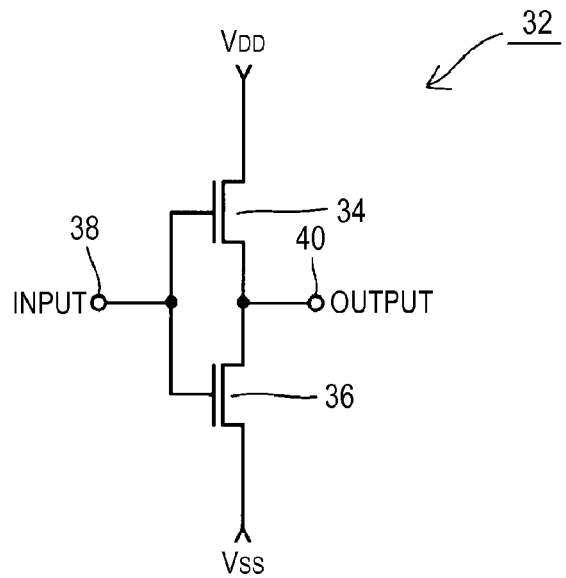
FIG. 4 is a circuit diagram of each of CMOS inverters 32 that constitute a variable delay element 14 shown in FIG. 3.
Figure 5:
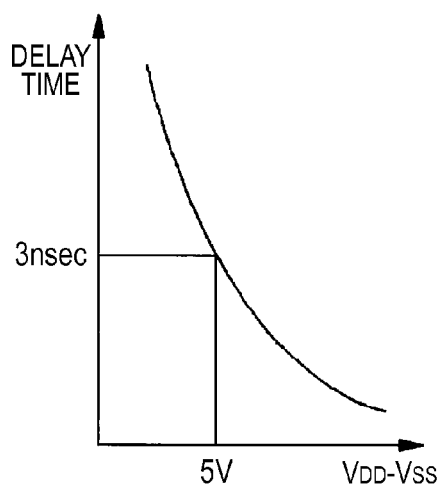
FIG. 5 is a graph showing a supply voltage difference vs. delay time characteristic of each CMOS inverter 32 shown in FIG. 4.
Figure 6:
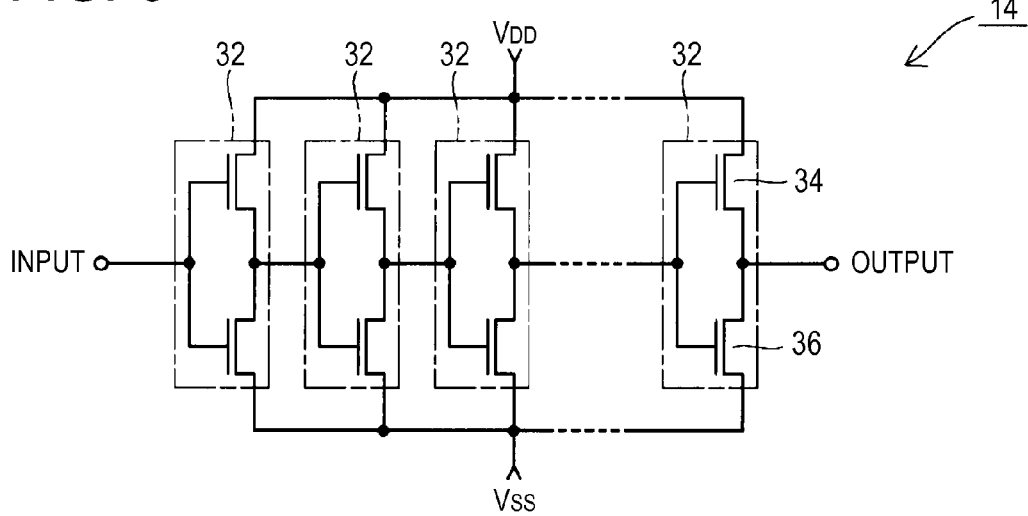
FIG. 6 is a circuit diagram of the variable delay element 14 shown in FIG. 3.

FIG. 3 shows a first specific example of the modification (FIG. 2) of the self-oscillating class-D amplifier according to the first embodiment. In the first specific example, the variable delay element 14 is a binary signal variable delay circuit which is a cascade connection of plural CMOS inverters (logic inverter circuits) 32. As shown in FIG. 4, in each CMOS inverter 32, the gates of a p-channel MOSFET 34 and an n-channel MOSFET 36 are connected to each other and their drains are also connected to each other. Supply voltages $V_{DD}$ and $V_{SS}$ are applied to the respective sources, a signal is input to the gates, and an inverted signal of the input signal is output from the drains to an output terminal 40. A delay time occurs between the input and the output of each CMOS inverter 32. As shown in FIG. 5, the delay time depends on the supply voltage difference $V_{DD}-V_{SS}$, that is, the delay time becomes longer as the supply voltage difference $V_{DD}-V_{SS}$ decreases. Therefore, utilizing this property, the delay time of each CMOS inverter 32 can be controlled at will by variably controlling the supply voltage difference $V_{DD}-V_{SS}$. A delay time of about 3 to 5 ns can be obtained per CMOS inverter 32. The variable delay element 14 shown in FIG. 3 is configured by cascade-connecting plural CMOS inverters 32 (see FIG. 6) to obtain a wide delay time variation range. Therefore, the number of cascade connection stages of CMOS inverters 32 can be set in accordance with a locking range to be realized with the frequency/phase-locked loop 33. The number of cascade connection stages is set at an even number or an odd number depending on whether an output signal and an output signal of the variable delay element 14 should be in phase or out of phase. A variable delay circuit using CMOS inverters is described in detail in Japanese Patent No. 2,679,032 of the present applicant.

Referring to FIG. 3, operating on positive and negative supply voltages $\pm B_L$, the input comparator 20 receives, at the non-inverting input terminal, an analog audio input signal supplied from the input terminal 21 and receives a feedback signal at the inverting input terminal. The input comparator 20 compares the signal levels of the two signals, and outputs a PWM signal whose value varies between two values "1" and "0" in accordance with the magnitudes of the two signal levels. The PWM signal that is output from the input comparator 20 is variably delayed by the variable delay element 14 and input to the output unit 22. The output unit 22 is equipped with two MOSFETs 44 and 46 and an FET driver 48 for driving them and operates on positive and negative supply voltages $\pm B_H$ ($B_H > B_L$). Incorporating a level shift circuit, the FET driver 48 level-shifts the PWM signal that is output from the variable delay element 14 into a voltage for driving the MOSFETs 44 and 46, converts it into signals for driving the MOSFETs 44 and 46, and drives (switches) the MOSFETs 44 and 46 using these signals. A power-amplified PWM signal that is output from the connecting point of the MOSFETs 44 and 46 is supplied to an LC lowpass filter 30 which is composed of a coil L1 and a capacitor C1, and is converted there into an audio signal, which is supplied to the output terminal (speaker terminal) 31. The output audio signal is fed back to the feedback input of the input comparator 20 via the feedback circuit 24 which is composed of resistors R1 and R2 which determine a feedback amount and a capacitor C2 which compensates the phase characteristic.

Figure 7:
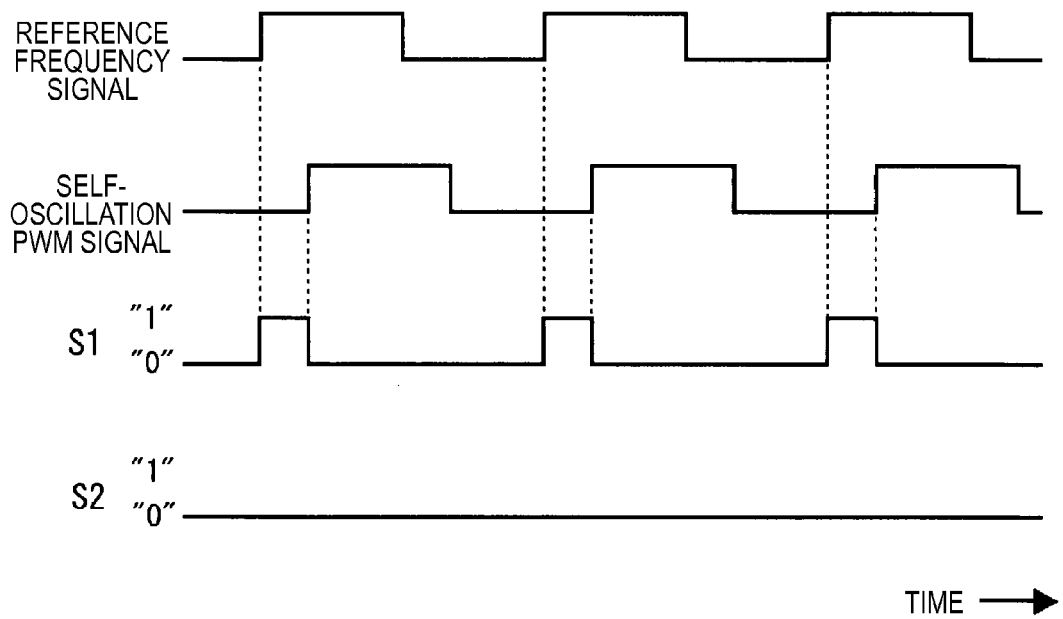
FIG. 7 is a waveform diagram illustrating how a phase comparator 26 shown in FIG. 3 operates in a case that a self-oscillation PWM signal is delayed in phase from a reference frequency signal.
Figure 8:
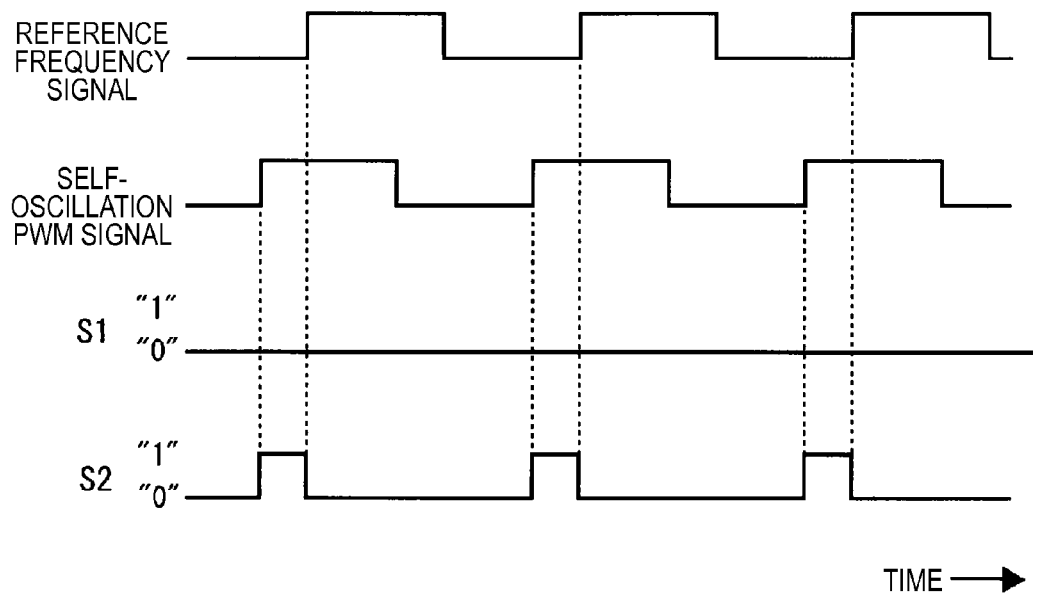
FIG. 8 is a waveform diagram illustrating how the phase comparator 26 shown in FIG. 3 operates in a case that the self-oscillation PWM signal is in advance of the reference frequency signal in phase.

The self-oscillation PWM signal that is output from the variable delay element 14 is input to the phase comparator 26. The phase comparator 26 outputs pulse signals S1 and S2 having a duty ratio that corresponds to the phase difference between the PWM signal and a reference frequency signal. More specifically, as shown in FIG. 7, when the self-oscillation PWM signal is delayed in phase from the reference frequency signal, the pulse signal S1 is kept at "1" (after a rise from "0") only during a period from a rise of the reference frequency signal to a rise of the self-oscillation PWM signal and the pulse signal S2 remains "0." As shown in FIG. 8, when the self-oscillation PWM signal is in advance of the reference frequency signal in phase, the pulse signal S1 remains "0" and the pulse signal S2 is kept at "1" (after a rise from "0") only during a period from a rise of the self-oscillation PWM signal to a rise of the reference frequency signal. These pulse signals S1 and S2 are input to the loop filter 28. Since the pulse width of the self-oscillation PWM signal which is output from the variable delay element 14 varies, in a strict sense the duty ratios of individual pulse signals that are output from the phase comparator 26 do not correspond to the phase difference between the reference frequency signal and the self-oscillation PWM signal. However, since the duty ratio correspond to the phase difference on average, the voltage of a DC signal obtained by averaging the pulse signal that is output from the phase comparator 26 corresponds to the phase difference between the reference frequency signal and the self-oscillation PWM signal. On the other hand, if as described above a frequency-divided version of the self-oscillation PWM signal is input to the phase comparator 26, the duty ratios of individual pulse signals that are output from the phase comparator 26 can be made to correspond to the phase difference between the reference frequency signal and the self-oscillation PWM signal even in a strict sense.

As shown in FIG. 3, the loop filter 28 is equipped with a charge pump 52, which is configured in such a manner that a current source 54, switches (MOSFETs) 56 and 58, and a current source 60 are cascade-connected between a power source $+B_L$ and the ground potential. The switches 56 and 58 are switched according to the respective pulse signals S1 and S2 (turned on when the pulse signal is at "1" and turned off when the pulse signal is at "0"). A capacitor C3 is connected between the connecting point of the switches 56 and 58 and the ground potential. Therefore, when the switch 56 is turned on (the switch 58 remains off; the self-oscillation PWM signal is delayed in phase from the reference frequency signal), a constant current flows into the capacitor C3 and the capacitor C3 is charged during the on-period. When the switch 58 is turned on (the switch 56 remains off; the self-oscillation PWM signal is in advance of the reference frequency signal in phase), a constant current flows out of the capacitor C3 and the capacitor C3 is discharged during the on-period. In this manner, the voltage of the capacitor C3 increases when the self-oscillation PWM signal is delayed in phase from the reference frequency signal and decreases when the self-oscillation PWM signal is in advance of the reference frequency signal in phase. The voltage of the capacitor C3 is applied to the base of a transistor 62. A supply voltage $+B_H$ is applied to the collector of the transistor 62. As a result, a voltage $V_{cont}$ which is equal to the voltage of the capacitor C3 minus the base-emitter voltage of the transistor 62 is obtained at the emitter of the transistor 62. The voltage $V_{cont}$ is output from the loop filter 28 and applied to each CMOS inverter 32 of the variable delay element 14 as the positive-side supply voltage ($V_{DD}$). In the specific example of FIG. 3, the negative-side supply voltage ($V_{SS}$) of each CMOS inverter 32 is the ground potential. When the self-oscillation PWM signal is delayed in phase from the reference frequency signal, the voltage $V_{cont}$ is increased and hence the delay time of each CMOS inverter 32 is shortened (see FIG. 5), whereby the phase of the self-oscillation PWM signal is advanced. When the self-oscillation PWM signal is in advance of the reference frequency signal in phase, the voltage $V_{cont}$ is decreased and hence the delay time of each CMOS inverter 32 is elongated, whereby the phase of the self-oscillation PWM signal is delayed. As a result of this control, even if the self-oscillation frequency of the frequency/phase-locked loop 33 is deviated from the reference frequency at a start of the control (i.e., immediately after power-on of the class-D amplifier), the self-oscillation PWM signal can be put into a state that it is locked in frequency and phase with the reference frequency signal (phase-locked state) as long as the self-oscillation frequency is within a capturing range of frequency/phase-locked loop 33.

The self-oscillating class-D amplifier according to the first embodiment (see FIG. 1) can also be configured in the same manner as the specific example of FIG. 3 except for the start position of the feedback path 13b.

Example Experiment for Specific Example 1 of Modification of Embodiment 1

Figure 9:
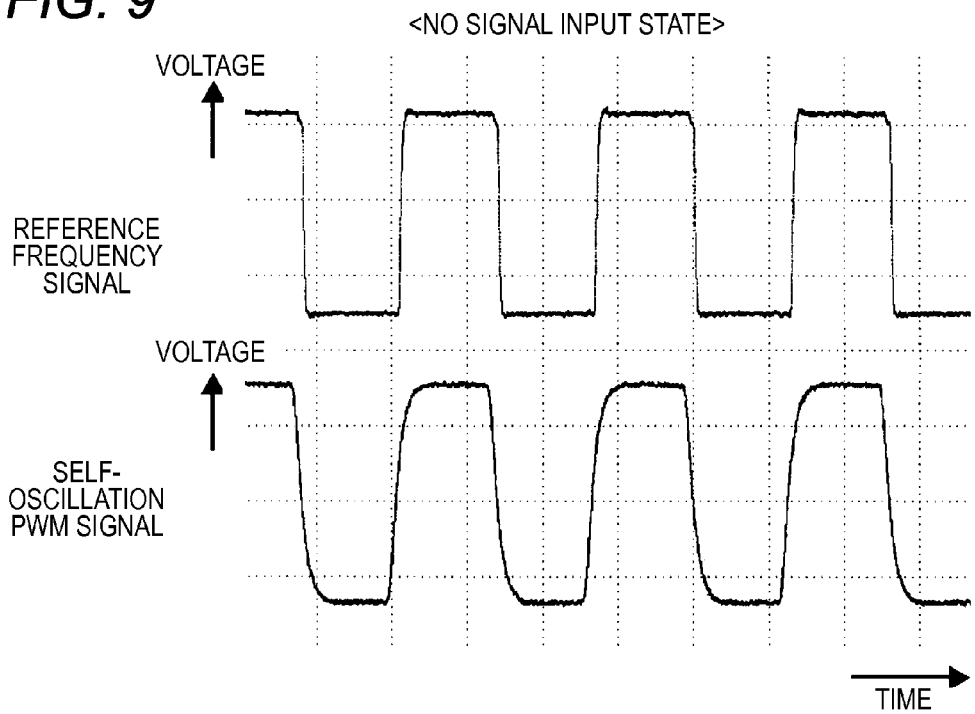
FIG. 9 is a waveform diagram of waveforms of a self-oscillation PWM signal and a reference frequency signal that were observed at the output position of the variable delay element 14 in a no signal input state in a frequency/phase locking experiment that was carried out by forming a trial circuit of the first specific example (see FIG. 3) of the modification of the first embodiment.
Figure 10:
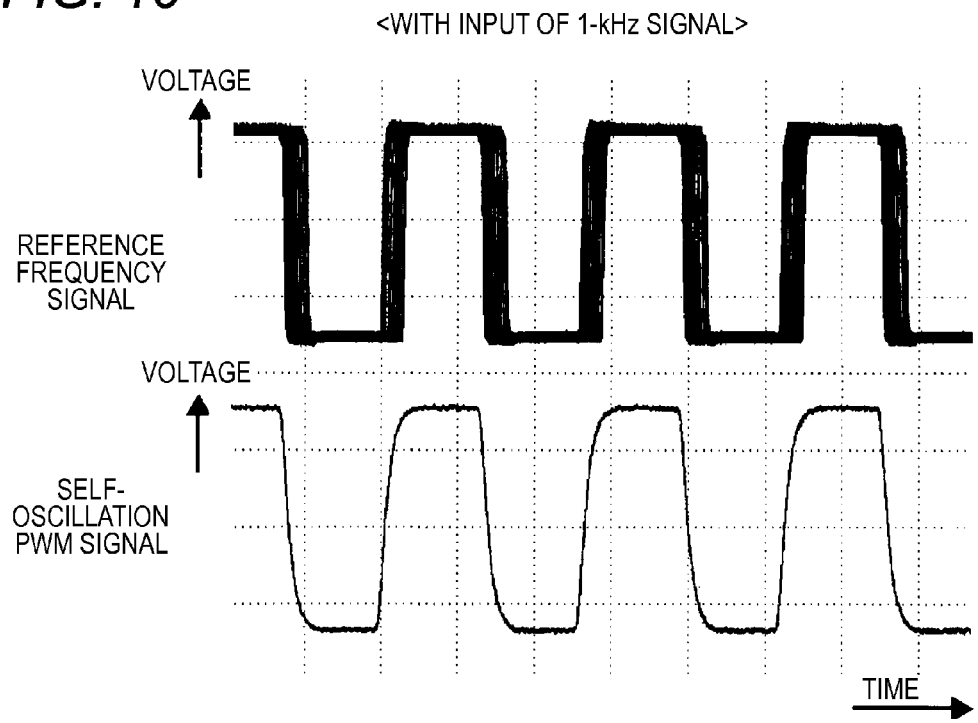
FIG. 10 is another waveform diagram of waveforms of a self-oscillation PWM signal and a reference frequency signal that were observed at the output position of the variable delay element 14 with input of a 1-kHz signal in the same frequency/phase locking experiment.

An experiment for confirming that a frequency/phase-locked state can be obtained was carried out by forming a specific trial circuit. In this experiment, the supply voltages $\pm B_L$ and $\pm B_H$ were set at $\pm 5$ V and $\pm 12$ V, respectively, and the frequency of a reference frequency signal (clock signal) to be input to the phase comparator 26 was set at 384 kHz. A waveform of the reference frequency signal and a waveform of a self-oscillation PWM signal which was output from the variable delay element 14 were observed when no signal was input to the input terminal 21 (no signal input state; the speaker output voltage at the output terminal 31: 0 V) and when a 1-kHz signal was input (the speaker output voltage at the output terminal 31: 0.3 V), with no speaker connected to the output terminal 31 (no load state). Observation results are shown in FIGS. 9 and 10. FIG. 9 shows waveforms obtained when no signal was input. FIG. 10 shows waveforms obtained when a 1-kHz signal was input. In either case, it is seen that the self-oscillation PWM signal is put into a state that it is phase-locked with the reference frequency signal.

Specific Example 2 of Modification of Embodiment 1

Figure 11:
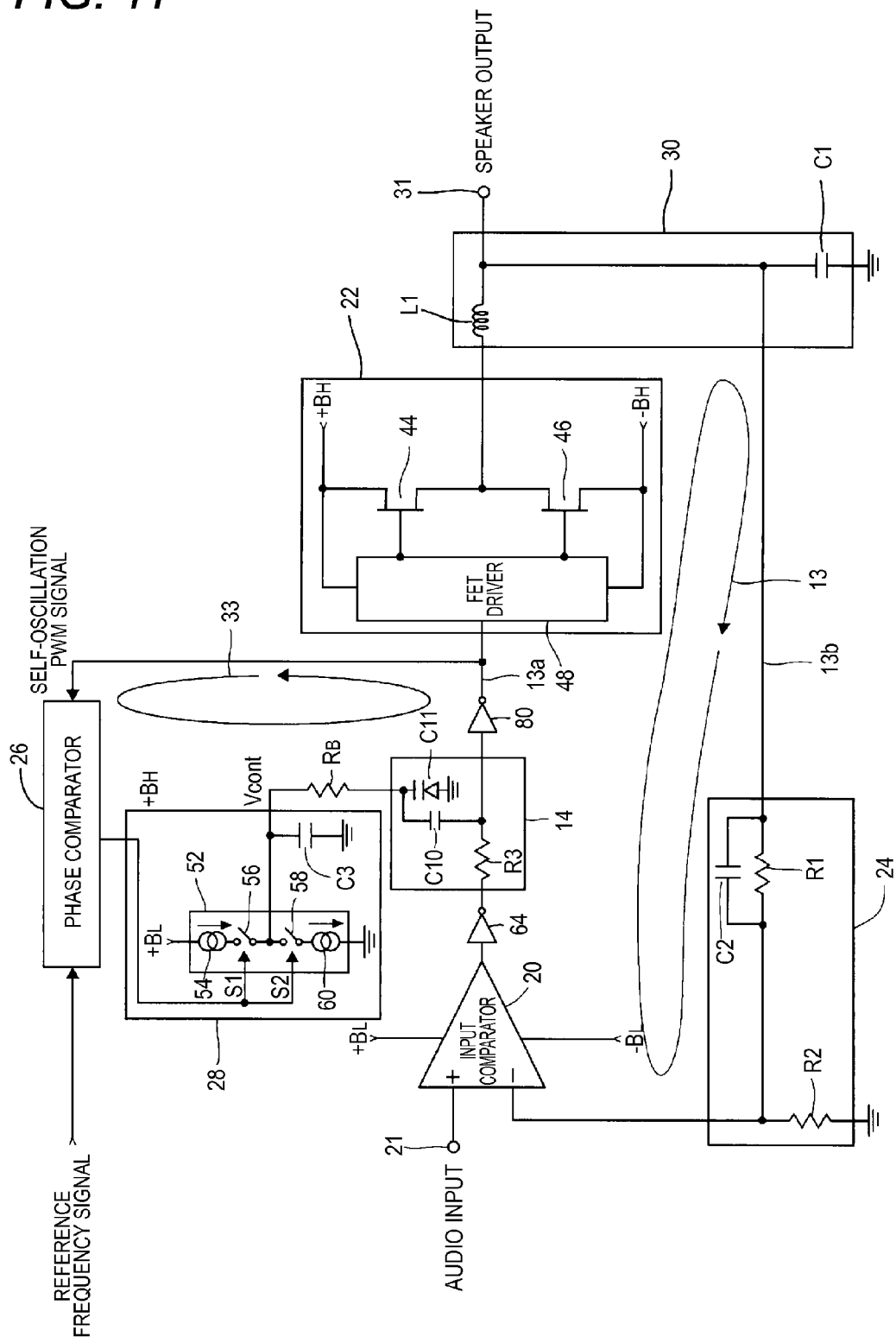
FIG. 11 is a circuit diagram of a second specific example of the modification of the first embodiment shown in FIG. 2.

FIG. 11 shows a second specific example of the modification (FIG. 2) of the self-oscillating class-D amplifier according to the first embodiment. In the second specific example, the variable delay element 14 is a variable time constant circuit formed by an RC series circuit. The delay time of a PWM signal that passes through this circuit is variably controlled by variably controlling the time constant of the variable delay element 14. Components having corresponding ones in the specific example of FIG. 3 are given the same symbols as the latter and descriptions therefor will be omitted. A PWM signal that is output from the input comparator 20 is input to the variable delay element 14 via an inverter buffer 64. The variable delay element 14 is a series connection circuit of a resistor R3, a capacitor C10, and a varicap diode C11. An output voltage $V_{cont}$ of the loop filter 28 (i.e., the voltage of the capacitor C3) is applied to the varicap diode C11 via a large-resistance resistor $R_B$ as a reverse voltage. The capacitance of the varicap diode C11 decreases as the reverse voltage $V_{cont}$ increases. When the self-oscillation PWM signal is delayed in phase from the reference frequency signal, the voltage $V_{cont}$ of the capacitor C3 is increased and hence the capacitance of the varicap diode C11 is decreased. As a result, the time constant of the variable delay element 14 is made smaller and the phase of the self-oscillation PWM signal is advanced. When the self-oscillation PWM signal is in advance of the reference frequency signal in phase, the voltage $V_{cont}$ of the capacitor C3 is decreased and hence the capacitance of the varicap diode C11 is increased. As a result, the time constant of the variable delay element 14 is made larger and the phase of the self-oscillation PWM signal is delayed. As a result of this control, the self-oscillation PWM signal is locked in frequency and phase with the reference frequency signal. The output signal of the self-oscillation signal that is output from the variable delay element 14 is input to the output unit 22 via an inverter buffer 80.

Specific Example 3 of Modification of Embodiment 1

Figure 12:
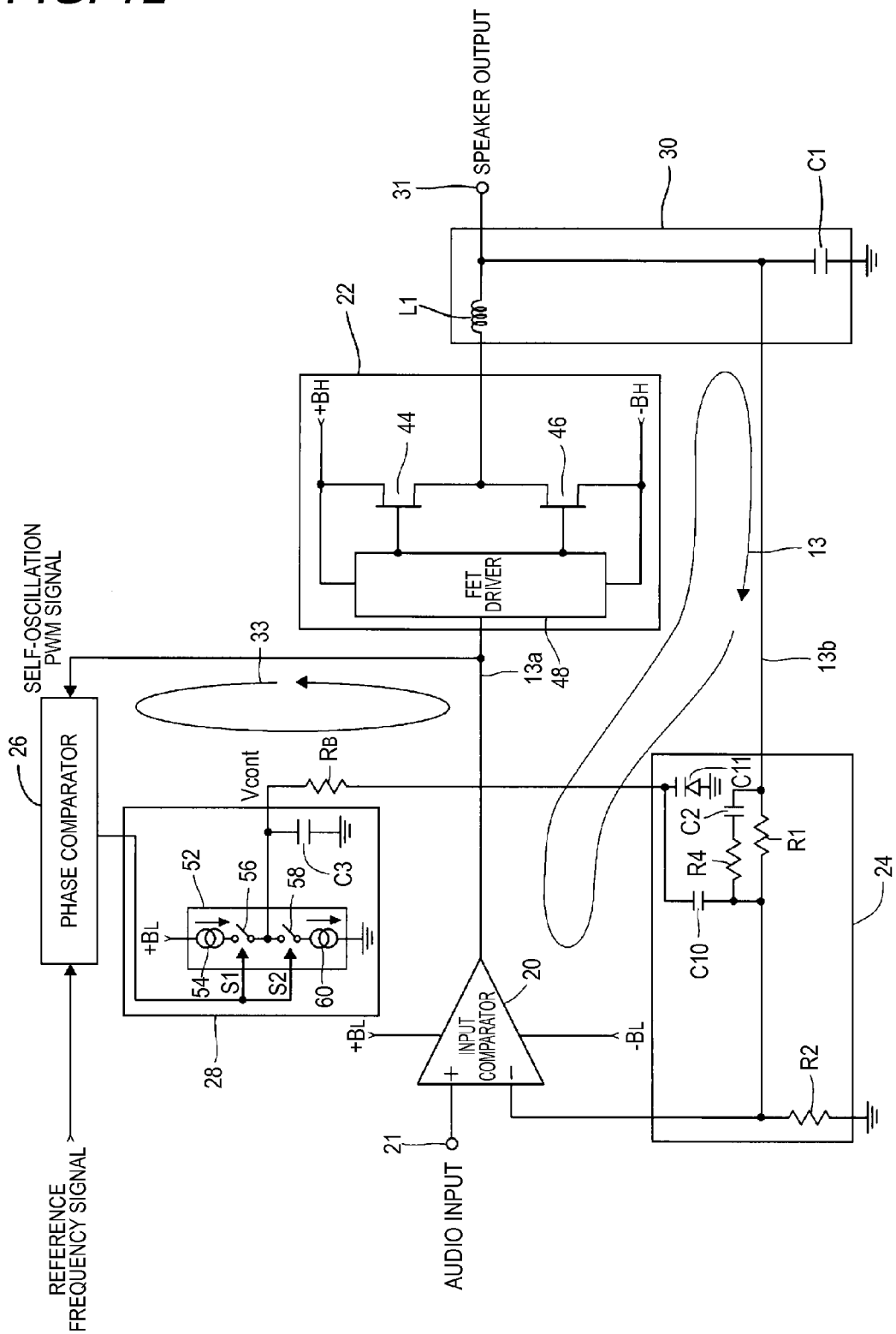
FIG. 12 is a circuit diagram of a third specific example of the modification of the first embodiment shown in FIG. 2.

FIG. 12 shows a third specific example of the modification (FIG. 2) of the self-oscillating class-D amplifier according to the first embodiment. Whereas in FIG. 11 the variable delay element 14 which is the variable time constant circuit formed by the RC series circuit is placed in the forward path 13a of the self-oscillation loop 13, in the third specific example the variable delay element 14 placed in the feedback path 13b so as to be integrated with the feedback circuit 24. Components having corresponding ones in FIG. 11 are given the same symbols as the latter and descriptions therefor will be omitted. A variable delay element/feedback circuit 66 is composed of resistors R1 and R2 which are series-connected between the output terminal 31 and the ground potential, a series connection of a capacitor C2 and a resistor R4 which is parallel-connected with the resistor R1, and a capacitor C10 and a varicap diode C11 which are series-connected between the connecting point of the resistors R1 and R2 and the ground potential. A feedback amount and a phase compensation amount of the self-oscillation loop 13 are set by the variable delay element/feedback circuit 66. An output voltage $V_{cont}$ of the loop filter 28 (i.e., the voltage of the capacitor C3) is applied to the varicap diode C11 via a large-resistance resistor $R_B$ as a reverse voltage. The capacitance of the varicap diode C11 varies with the reverse voltage $V_{count}$, whereby the time constant of the variable delay element/feedback circuit 66 is controlled and the delay time of the self-oscillation loop 13 is controlled to a prescribed value. More specifically, when the self-oscillation PWM signal is delayed in phase from the reference frequency signal, the voltage $V_{count}$ of the capacitor C3 is increased and hence the capacitance of the varicap diode C11 is decreased. As a result, the time constant of the variable delay element/feedback circuit 66 is made smaller and the phase of the self-oscillation PWM signal is advanced. When the self-oscillation PWM signal is in advance of the reference frequency signal in phase, the voltage $V_{count}$ of the capacitor C3 is decreased and hence the capacitance of the varicap diode C11 is increased. As a result, the time constant of the variable delay element/feedback circuit 66 is made larger and the phase of the self-oscillation PWM signal is delayed. As a result of this control, the self-oscillation PWM signal is locked in frequency and phase with the reference frequency signal. In the variable time constant circuit of FIGS. 11 and 12 which is the RC series circuit, the time constant is controlled by varying C (capacitance) using the varicap diode. Instead, R (resistance) of the RC series circuit may be varied. In this case, for example, a photoresistor using a CdS photocell or the like can be used as R.

Embodiment 2

Figure 13:
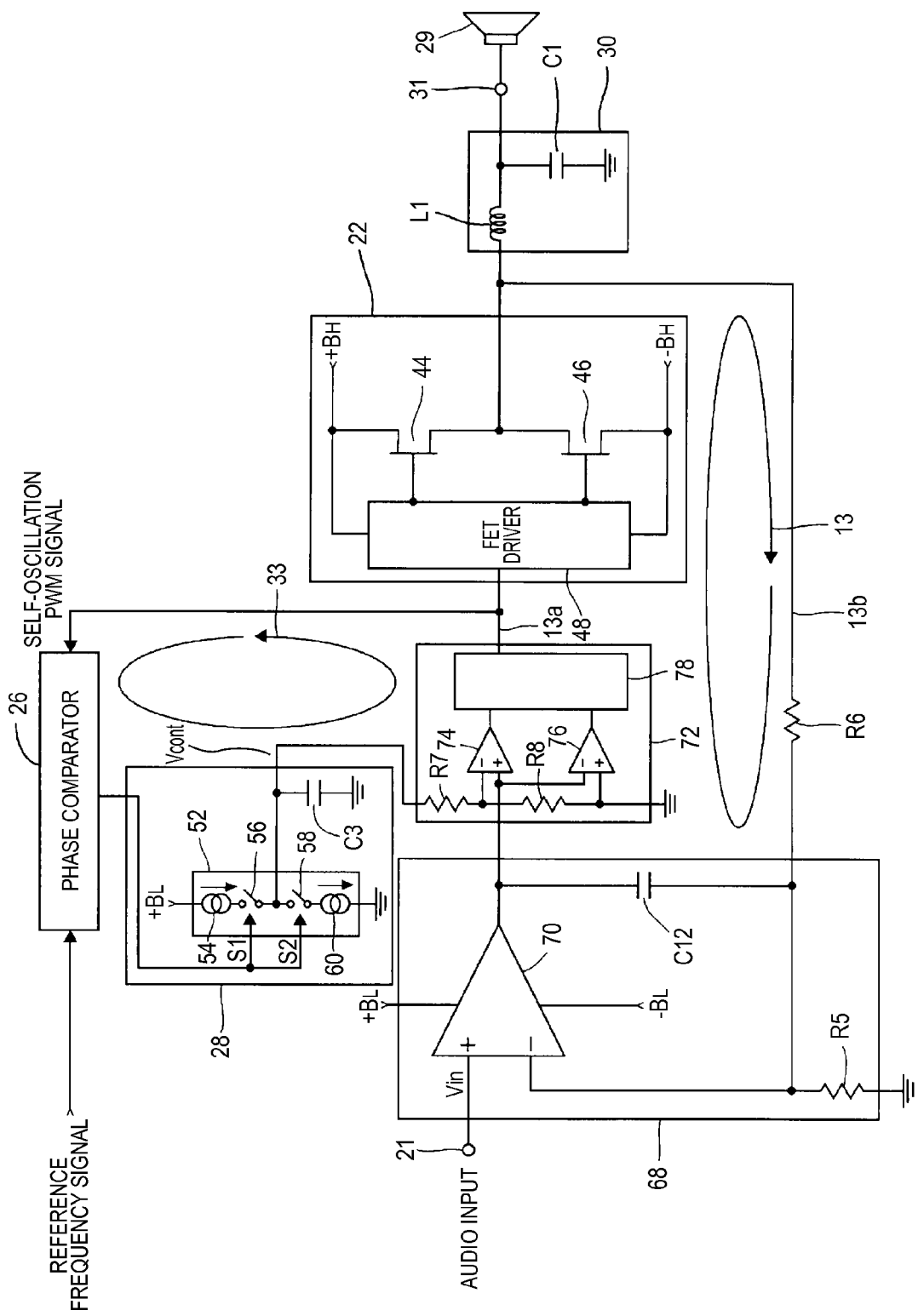
FIG. 13 is a block diagram of a self-oscillating class-D amplifier according to a second embodiment of the invention, which is a result of application of the invention to a self-oscillating class-D amplifier of such a type that self-oscillation is attained using an integration circuit and a hysteresis comparator.

FIG. 13 shows a self-oscillating class-D amplifier according to a second embodiment of the invention. This is a result of application of the invention to a self-oscillating class-D amplifier of such a type that self-oscillation is attained using an integration circuit which performs integration on an analog input signal and a feedback signal of a self-oscillation loop and a hysteresis comparator which receives an output signal of the integration circuit and outputs a binary signal. This type of self-oscillating class-D amplifier oscillates in a self-excited manner at a frequency corresponding to a hysteresis comparator inversion speed that is determined by a relationship between a charging/discharge rate of the integration circuit and a threshold voltage of the hysteresis comparator. Components having corresponding ones in FIG. 3, 11, or 12 will be given the same symbols as the latter and descriptions therefor will be omitted. In the technique disclosed in Patent document 4, a reference voltage of a hysteresis comparator provided in a self-oscillating class-D amplifier is variably controlled so as to become equal to a voltage that is calculated using an input signal voltage value and a drive voltage value of a power amplifier. In contrast, in this embodiment, the oscillation frequency is stabilized by variably controlling a reference voltage of a hysteresis comparator 72 according to the output voltage of the loop filter 28. An analog audio input signal is input from the input terminal 21 and supplied to an integration circuit 68. The integration circuit 68 is configured in such a manner that the input signal is input to the non-inverting input terminal of an operational amplifier 70, the inverting input terminal is grounded via a resistor R5, and a capacitor C12 is connected between the inverting input terminal and the output terminal. The output terminal of the output unit 22 is connected to the inverting input terminal of the operational amplifier 70 via a resistor R6.

An output signal of the integration circuit 68 is input to the hysteresis comparator 72. The hysteresis comparator 72 is equipped with two comparators 74 and 76. The output signal of the integration circuit 68 is input to the non-inverting input terminal of the comparator 74 and the inverting input terminal of the comparator 76. A variable voltage $V_h$ obtained by dividing the output voltage $V_{cont}$ of the loop filter 28 by resistors R7 and R8 is input to the inverting input terminal of the comparator 74 as one reference voltage (threshold voltage). The non-inverting input terminal of the comparator 76 is connected to the ground potential, whereby a fixed voltage 0 V is input to this non-inverting input terminal as the other reference voltage (threshold voltage). Thus, a difference voltage $V_h$ between the two reference voltages is given to the hysteresis comparator 72 as a hysteresis voltage. Output voltages of the comparators 74 and 76 are input to an S (set) input terminal and an R (reset) input terminal of an SR flip-flop circuit (hereinafter referred to as an SR-FF circuit) 78, respectively. An output signal (PWM signal) appearing at a Q output terminal of the SR-FF circuit 78 is input to the FET driver 48 of the output unit 22. The FET driver 48 power-amplifies the PWM signal by switching the output MOSFETs 44 and 46 according to the PWM signal. An audio signal is extracted by the lowpass filter 30 from the PWM signal that is output from the output unit 22, and is supplied to the speaker, whereby a sound is emitted. The output signal of the output unit 22 is fed back to the integration circuit 68 via the feedback path 13b.

A self-oscillation operation of the self-oscillating class-D amplifier of FIG. 13 is realized in the following manner. First, assume that an analog input signal $V_{in}$ is at 0 V (no signal). In a period when the Q output of the SR-FF circuit 78 is "H," the MOSFET 44 is on, and the MOSFET 46 is off, the capacitor C12 is charged in the negative direction by a current $+B_H/R6$, whereby the input signal voltage of the hysteresis comparator 72 lowers gradually. When the input signal voltage of the hysteresis comparator 72 becomes lower than the reference voltage 0 V, the output of the comparator 76 is inverted to "H" and the SR-FF circuit 78 is reset, that is, the Q output of the SR-FF circuit 78 is inverted to "L." In response, the MOSFET 44 is turned off and the MOSFET 46 is turned on. As a result, the capacitor C12 comes to be charged in the positive direction by a current $-B_H/R6$, whereby the input signal voltage of the hysteresis comparator 72 rises gradually. When the input signal voltage of the hysteresis comparator 72 becomes higher than the reference voltage $V_h$, the output of the comparator 74 is inverted to "H" and the SR-FF circuit 78 is set, that is, the Q output of the SR-FF circuit 78 is inverted to "H." In response, the MOSFET 44 is turned on and the MOSFET 46 is turned off. The above operation is repeated and self-oscillation is attained. When the analog input signal $V_{in}$ is at 0 V (no signal), the charging speed in the negative direction of the capacitor C12 and that in the positive direction are the same. Therefore, the duty ratio of the PWM signal that is output from the output unit 22 becomes 50% and the signal level of the output audio signal of the lowpass filter 30 becomes 0 V.

On the other hand, where the analog input signal $V_{in}$ is positive, in a period when the Q output of the SR-FF circuit 78 is "H," the MOSFET 44 is on, and the MOSFET 46 is off, the capacitor C12 is charged in the negative direction by a current that is approximately equal to $+B_H/R6-V_{in}/R5$. In a period when the Q output of the SR-FF circuit 78 is "L," the MOSFET 44 is off, and the MOSFET 46 is on, the capacitor C12 is charged in the positive direction by a current that is approximately equal to $-B_H/R6-V_{in}/R5$. Since the charging speed in the negative direction of the capacitor C12 is lower than that in the positive direction, the period in which the MOSFET 44 is on is longer than the period in which the MOSFET 46 is on. Therefore, the duty ratio of the PWM signal that is output from the output unit 22 becomes larger than 50%. Conversely, where the analog input signal $V_{in}$ is negative, in a period when the Q output of the SR-FF circuit 78 is "H," the MOSFET 44 is on, and the MOSFET 46 is off, the capacitor C12 is charged in the negative direction by a current that is approximately equal to $+B_H/R6+V_{in}/R5$. In a period when the Q output of the SR-FF circuit 78 is "L," the MOSFET 44 is off, and the MOSFET 46 is on, the capacitor C12 is charged in the positive direction by a current that is approximately equal to $-B_H/R6+V_{in}/R5$. Since the charging speed in the negative direction of the capacitor C12 is higher than that in the positive direction, the period in which the MOSFET 44 is on is shorter than the period in which the MOSFET 46 is on. Therefore, the duty ratio of the PWM signal that is output from the output unit 22 becomes smaller than 50%. In this manner, the output unit 22 outputs a PWM signal whose duty ratio reflects the level of the analog input signal $V_{in}$.

A self-oscillation frequency stabilizing operation of the self-oscillating class-D amplifier of FIG. 13 is realized in the following manner. The phase comparator 26 receives a self-oscillation PWM signal that is output from the hysteresis comparator 72 and a clock signal (reference frequency signal) having a prescribed reference frequency (about several hundreds of kilohertz) and compares the phases of the two signals to output a pulse signal having a pulse width (duty ratio) corresponding to their phase difference (e.g., a rise time difference). The loop filter 28 averages the pulse signal that is output from the phase comparator 26 and thereby converts it into a DC signal that reflects the phase difference. It is assumed that the loop filter 28 shown in FIG. 13 is such that the switch 56 is turned on and off according to a pulse signal S2 and the switch 58 is turned on and off according to a pulse signal S1, which is reverse to the case of the loop filter 28 shown in each of FIGS. 3, 11, and 12. As a result, the output voltage of the loop filter 28 decreases when the self-oscillation PWM signal is delayed in phase from the reference frequency signal, and increases when the self-oscillation PWM signal is in advance of the reference frequency signal in phase. The DC signal that is output from the loop filter 28 id divided by the resistors R7 and R8, and a resulting divisional voltage $V_h$ is applied to the hysteresis comparator 72 as a hysteresis voltage. When the self-oscillation PWM signal is delayed in phase from the reference frequency signal, the hysteresis voltage $V_h$ is decreased and hence the inversion cycle of the hysteresis comparator 72 becomes shorter. On the other hand, when the self-oscillation PWM signal is in advance of the reference frequency signal in phase, the hysteresis voltage $V_h$ is increased and hence the inversion cycle of the hysteresis comparator 72 becomes longer. As a result, the self-oscillation PWM signal is locked with the reference frequency signal in frequency and phase. As such, the phase comparator 26, the loop filter 28, and the self-oscillation loop 13 constitute a frequency/phase-locked loop with the self-oscillation loop 13 serving as a VCO. In this manner, the self-oscillation frequency of the self-oscillation loop 13 is stabilized with high accuracy.

Embodiment 3

Figure 14:
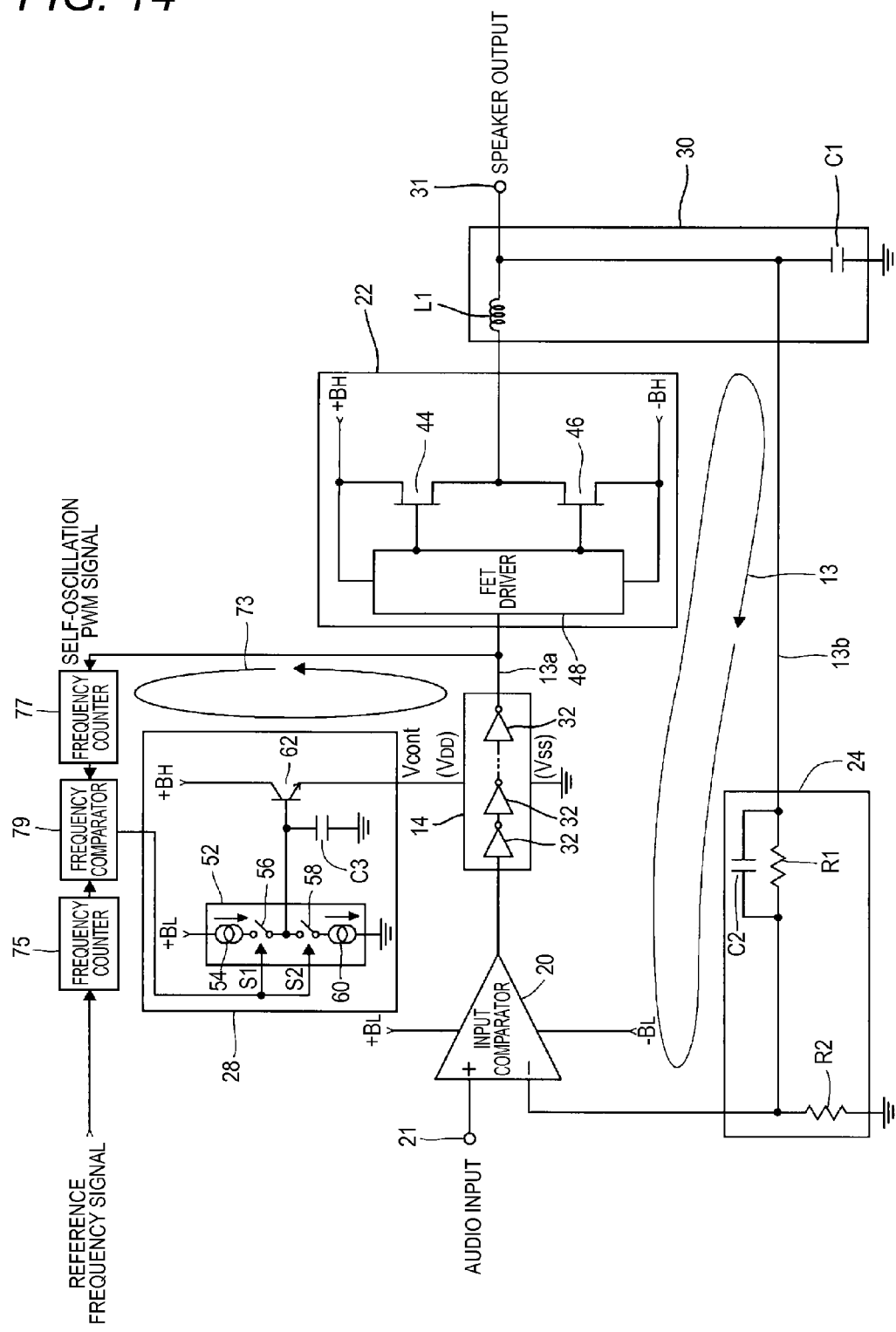
FIG. 14 is a block diagram of a self-oscillating class-D amplifier according to a third embodiment of the invention which is different from the circuit of FIG. 3 in that a frequency control loop 73 without a phase locking control is provided in place of a frequency/phase-locked loop 33 (frequency control loop).
Figure 15:
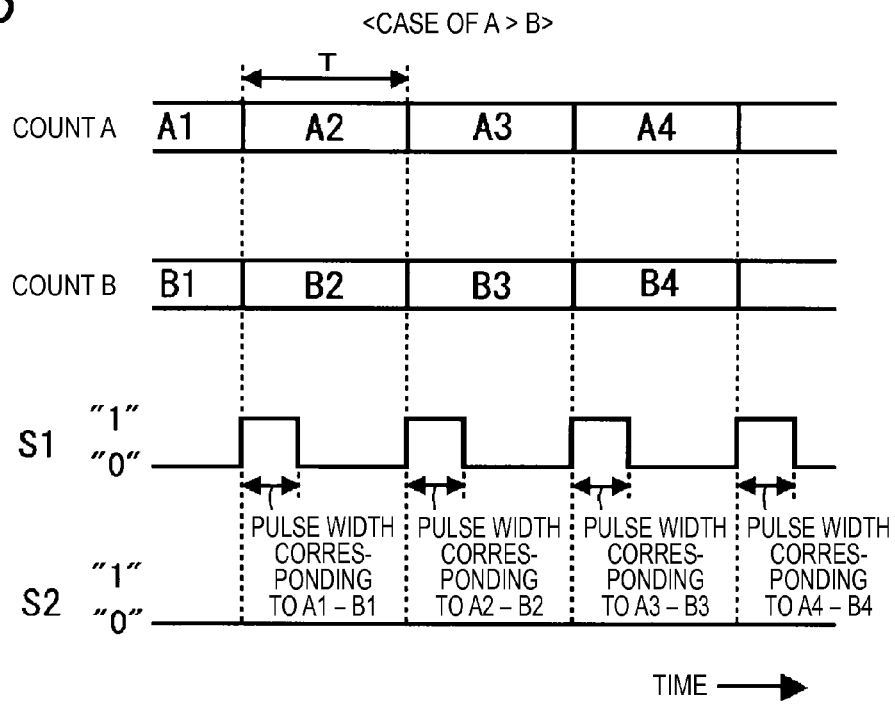
FIG. 15 is a waveform diagram illustrating how a frequency comparator 79 shown in FIG. 14 operates in the case where the frequency of a self-oscillation PWM signal is lower than that of a reference frequency signal.
Figure 16:
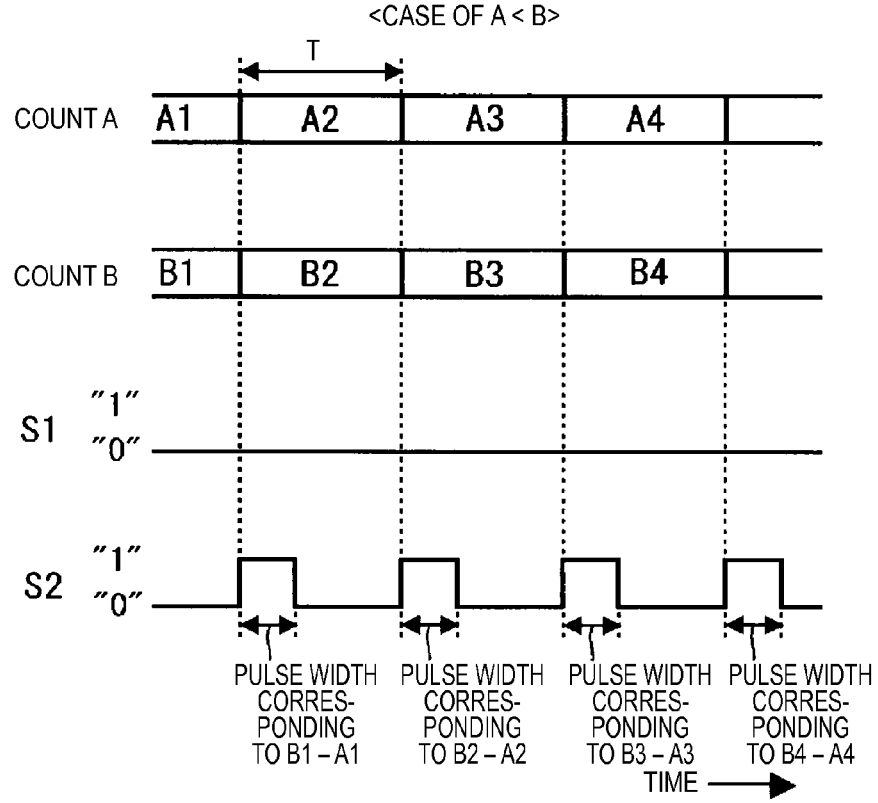
FIG. 16 is a waveform diagram illustrating how the frequency comparator 79 shown in FIG. 14 operates in the case where the frequency of the self-oscillation PWM signal high lower than that of the reference frequency signal.

FIG. 14 shows a self-oscillating class-D amplifier according to a third embodiment of the invention which is different from the circuit of FIG. 3 in that a frequency control loop 73 without a phase locking control is provided in place of the frequency/phase-locked loop 33 (frequency control loop). Components having corresponding ones in FIG. 3 are given the same symbols as the latter and descriptions therefor will be omitted. The frequency control loop 73 is equipped with the following components in place of the phase comparator 26 shown in FIG. 3. A frequency counter 75 counts the number of pulses of a reference frequency signal every predetermined time T. A frequency counter 77 counts the number of pulses of a self-oscillation PWM signal also every predetermined time T. A frequency comparator 79 compares respective final counts A and B (which are pieces of information corresponding to the reference frequency and the frequency of the self-oscillation PWM signal, respectively) of the frequency counters 75 and 77 every predetermined time T, and outputs pulse signals S1 and S2 having a pulse width (duty ratio) corresponding to the difference between the counts A and B of the two respective signals. When A>B (the frequency of the self-oscillation PWM signal is lower than the reference frequency), as shown in FIG. 15 the pulse signal S1 is kept at "1" (after a rise from "0") only for a time corresponding to the difference between the count A (A1≅A2≅A3≅ . . . ) and the count B (or for a prescribed fixed time) and the pulse signal S2 remains "0." When A<B (the frequency of the self-oscillation PWM signal is higher than the reference frequency), as shown in FIG. 16 the pulse signal S1 remains "0" and the pulse signal S2 is kept at "1" (after a rise from "0") only for a time corresponding to the difference between the counts A and B (or for a prescribed fixed time). When A=B, both of the pulse signals S1 and S2 remain "0."

In the circuit of FIG. 14, as in the circuit of FIG. 3, the pulse signals S1 and S2 are input to the loop filter 28 and averaged therein. A voltage $V_{cont}$ that is output from the loop filter 28 is applied to each CMOS inverter 32 of the variable delay element 14 as a positive-side supply voltage ($V_{DD}$), whereby the delay time of the variable delay element 14 is controlled variably. As a result of this control, the frequency of the self-oscillation PWM signal is controlled so as to become equal to or close to the frequency of the reference frequency signal. Even if a beat occurs when plural self-oscillating class-D amplifiers are set at short distances and operate simultaneously because the frequency of the self-oscillation PWM signal does not completely equal to the frequency of the reference frequency signal, it is not problematic in terms of auditory sensation if its frequency is lower than the audible frequency range.

In FIG. 14, another type of frequency control loop 73 can be formed by replacing the frequency counter 75 with a cycle counter for measuring a cycle of a reference frequency signal (its count is information corresponding to a reference cycle) and replacing the frequency counter 77 with a cycle counter for measuring a cycle of a self-oscillation PWM signal (its count is information corresponding to a cycle of the self-oscillation PWM signal). Although in FIG. 14 information corresponding to a reference frequency is obtained by counting the number of pulses of the reference frequency signal with the frequency counter 75, information corresponding to the reference frequency or information corresponding to the reference cycle may be given as first-hand, fixed numerical information without using the reference frequency signal or the counter 75. Also in each of the circuits of FIGS. 11, 12, and 13, a frequency control loop without a phase locking control can be formed by replacing the phase comparator 26 with the frequency counters 75 and 77 (or cycle counters) and the frequency comparator 79 (or giving information corresponding to the reference frequency or information corresponding to the reference cycle as fixed numerical information without using the reference frequency signal or the frequency counter 75).

Modification of Circuit of FIG. 3

Figure 17:
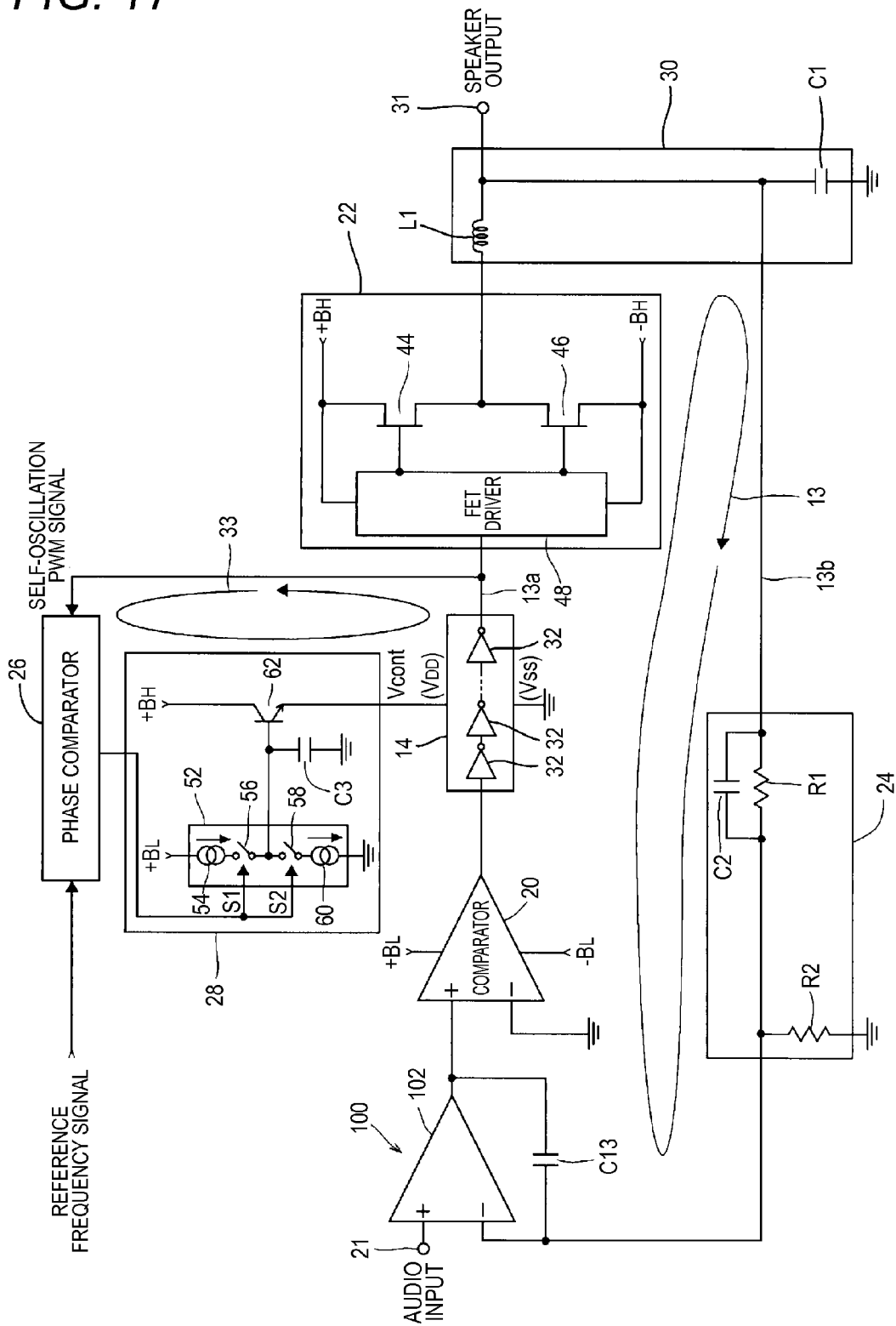
FIG. 17 is a circuit diagram of a modification of the circuit of FIG. 3.

FIG. 17 shows a modification of the circuit of FIG. 3. In the circuit of FIG. 3, if a input signal having a larger waveform is input to the input comparator 20 by increasing the loop gain of the self-oscillation loop 13, it becomes easier for the input comparator 20 to compare the signal levels of the input signal and a feedback signal, as a result of which the accuracy of the pulse width modulation by the input comparator 20 is increased and hence the audio signal characteristics (distortion characteristic etc.) can be improved. However, if the gain were increased in a wide frequency range by inserting an amplifier at the input of the self-oscillation loop 13 (i.e., before the input comparator 20) in the circuit of FIG. 3, the gain would be increased also in the self-oscillation frequency range and, as a result, the self-oscillation condition would be varied to cause problems such as a variation of the self-oscillation frequency. In view of this, in the circuit of FIG. 17, instead of a wideband amplifier an integration circuit is inserted at the input of the self-oscillation loop 13 so that the gain is increased in an audio frequency range and is not varied in the self-oscillation frequency range.

As shown in FIG. 17, an analog audio input signal that is input from the input terminal 21 is input to an input integration circuit 100. The input integration circuit 100 is configured in such a manner that the analog audio input signal is input to the non-inverting input terminal of an operational amplifier 102, its inverting input terminal is grounded via a resistor R2, and a capacitor C13 is connected between the inverting input terminal and an output terminal. A feedback signal coming from the lowpass filter 30 is fed back to the inverting input terminal of the operational amplifier 102. The characteristics of the input integration circuit 100 are set so that the gain is increased in the frequency range (e.g., lower than or equal to 20 kHz) of the analog audio input signal and is not varied (the gain is kept approximately equal to "1") in the self-oscillation frequency range (e.g., several hundreds of kilohertz). The gain of the input integration circuit 100 may be kept approximately equal to "1" in the self-oscillation frequency range by setting the capacitances of the capacitor C13 of the input integration circuit 100 and the capacitor C2 of the feedback path 13*b* of the self-oscillation loop 13 approximately equal to each other. By inserting the input integration circuit 100 having such characteristics at the input of the self-oscillation loop 13, the gain in the audio frequency range can be made higher than in the circuit of FIG. 3 without varying the self-oscillation condition (i.e., without varying the open-loop gain) from the case without the input integration circuit 100 (i.e., the circuit of FIG. 3). An output signal of the input integration circuit 100 is input to the non-inverting input terminal of the comparator 20 (which is the same as the comparator 20 shown in FIG. 3). The inverting input terminal of the comparator 20 is grounded. Since the audio-band component of the input signal of the comparator 20 is given a large signal waveform by the input integration circuit 100, the accuracy of the pulse width modulation by the input comparator 20 is increased and hence the audio signal characteristics (distortion characteristic etc.) are improved. On the other hand, the self-oscillation band component of the input signal of the comparator 20 passes through the input integration circuit 100 so as to be processed there with a gain that is approximately equal to "1" and hence the self-oscillation condition is not varied. Therefore, there occur no such troubles as a variation of the self-oscillation frequency. The circuit of FIG. 17 is configured and operates in the same manners as the circuit of FIG. 3 except for what have been described above. Therefore, components having corresponding ones in FIG. 3 are given the same reference symbols as the latter and descriptions therefor will be omitted.

Application Example 1

Figure 18:
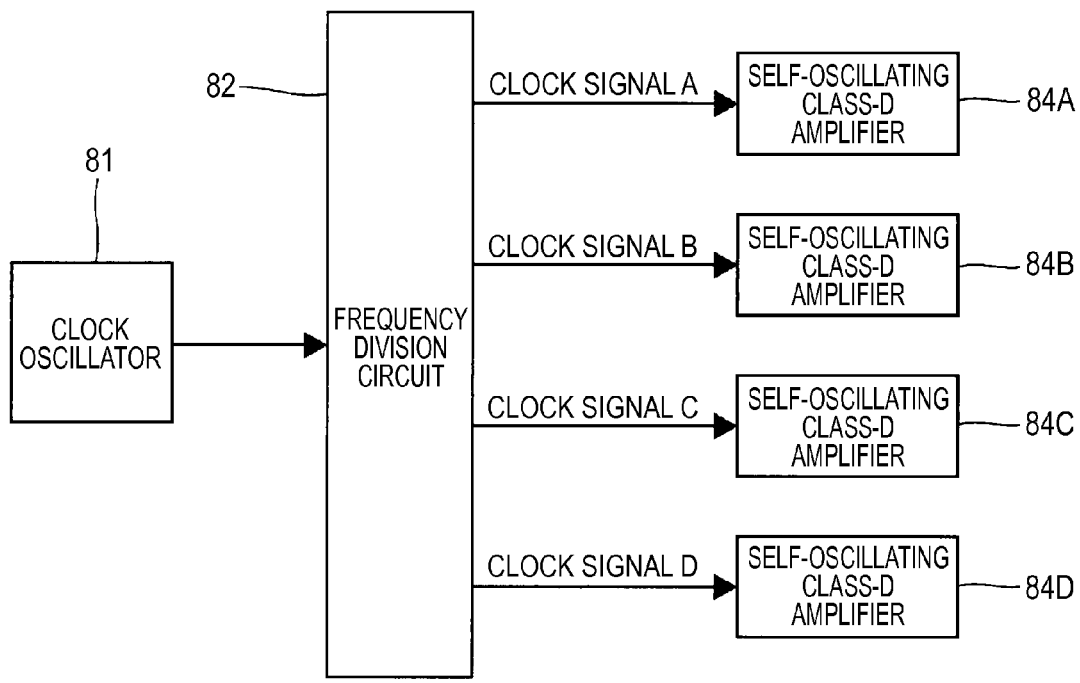
FIG. 18 is a block diagram of a first application example of the self-oscillating class-D amplifier according to the invention.
Figure 19:
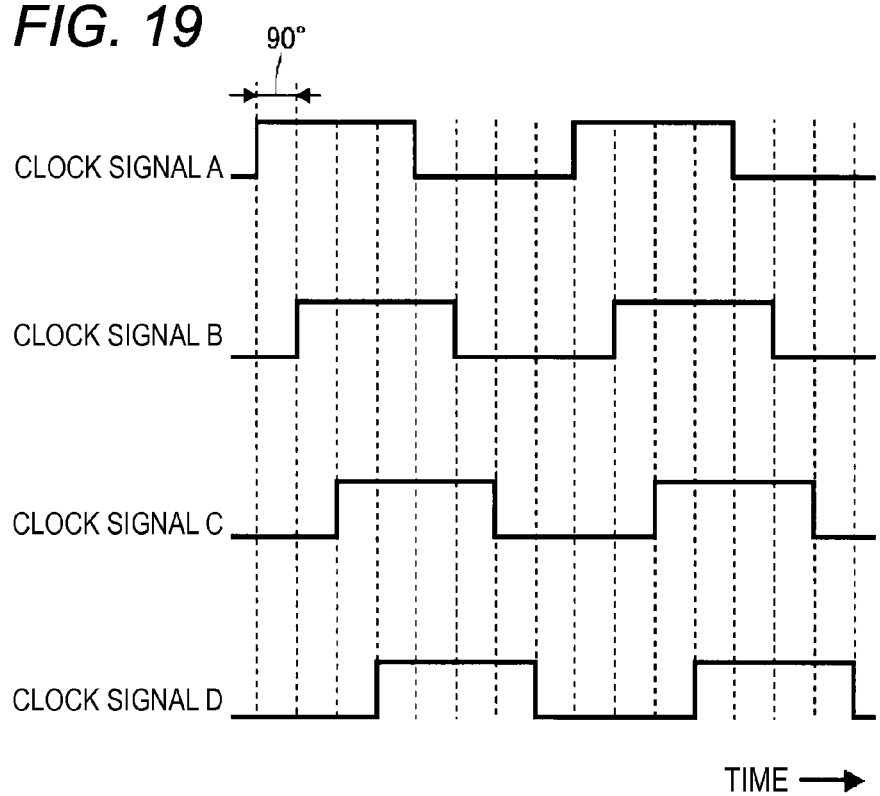
FIG. 19 is a waveform diagram showing clock signals (reference frequency signals) A, B, C, and D that are output from a frequency division circuit 82 shown in FIG. 18.

In the invention, where the frequency control loop is a frequency/phase-locked loop, a self-oscillation PWM signal can be phase-locked with a reference frequency signal. Therefore, when plural self-oscillating class-D amplifiers are set at short distances and operate simultaneously, although a beat sound can be prevented, an event may occur that the peak level of switching noises becomes high because the output switching elements of the respective class-D amplifiers are turned on or off simultaneously. One measure against this phenomenon is as follows. During a large output power operation in which a beat sound is not conspicuous, a frequency/phase-locked state is canceled temporarily so that the class-D amplifiers exhibit different self-oscillation frequencies and their switching elements are switched with deviations in timing, as an EMC (electromagnetic compatibility) measure (noise reduction). Another countermeasure is to form a frequency control loop without a phase locking control and thereby cause the switching elements to be switched with deviations in timing (EMC measure). A further countermeasure is possible in which although the frequency control loop is formed as a frequency/phase-locked loop, the class-D amplifiers employ reference frequency signals whose phases are deviated from each other, whereby the output switching elements of the respective class-D amplifiers are switched with deviations in timing while the frequency/phase-locked state is maintained (EMC measure). FIG. 18 shows an example system configuration of the last countermeasure. A clock oscillator 81 generates a reference clock signal having a prescribed frequency. This reference clock signal is frequency-divided by a frequency division circuit 82. As shown in FIG. 19, a resulting clock signal is a converted by plural systems of delay circuits, into plural clock signals (reference frequency signals) A, B, C, and D which are identical in frequency and are deviated from each other in phase by a prescribed value (in this example, 90°). Self-oscillating class-D amplifiers 84A, 84B, 84C, and 84D are self-oscillating class-D amplifiers according to the invention having the same configuration. The self-oscillating class-D amplifiers 84A, 84B, 84C, and 84D are driven in such a manner that a self-oscillation PWM signal is taken by a frequency/phase-locked loop and frequency/phase-locked with the reference frequency signal A, B, C, or D. With this configuration, the output switching elements of the respective class-D amplifiers 84A, 84B, 84C, and 84D are switched with deviations in timing, whereby switching noises are dispersed and the noise peak level is lowered.

Application Example 2

Figure 20:
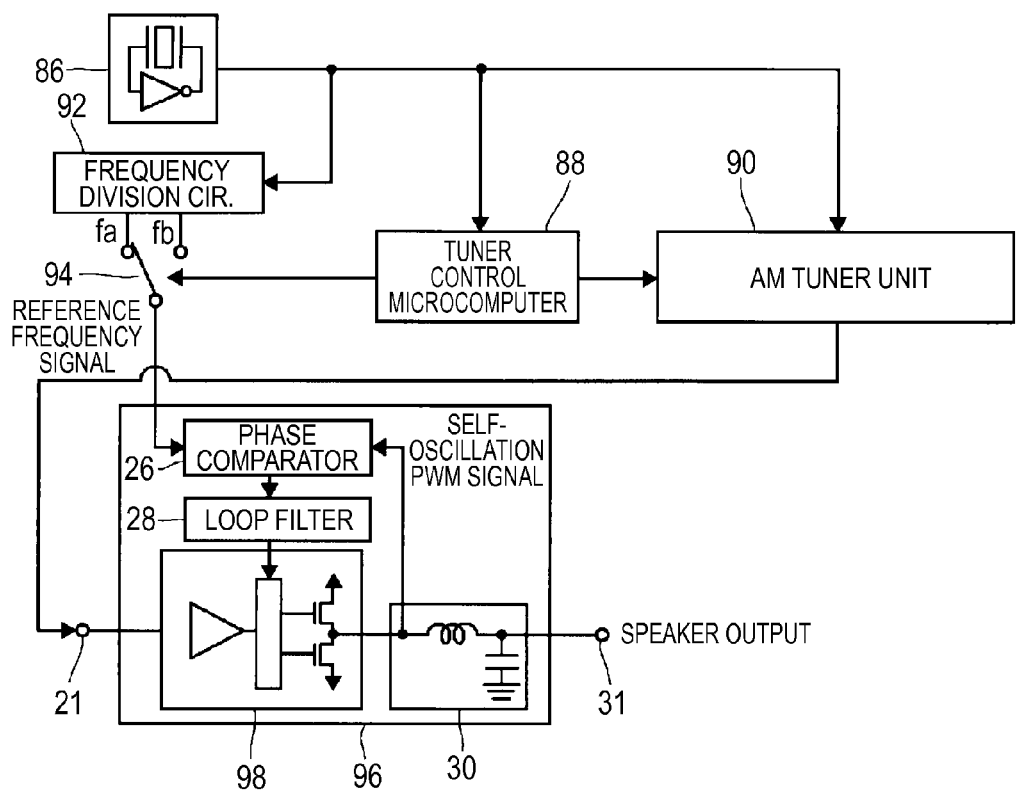
FIG. 20 is a block diagram of a second application example of the self-oscillating class-D amplifier according to the invention.

In many cases, the oscillation frequency of a class-D amplifier is set at about several hundreds of kilohertz. Class-D audio amplifiers that are combined with an auto-tuning AM tuner or the like are associated with a problem that it tunes in to the switching frequency or its harmonic frequencies in searching for broadcasting stations by auto-scanning (automatically increasing or decreasing) the reception frequency. In view of this, in conventional separately-excited oscillation class-D audio amplifiers that are combined with an auto-tuning AM tuner, during an auto-scanning operation, the switching frequency is switched according to the reception frequency so that the reception frequency at each time point does not become equal to the switching frequency or any of its harmonic frequencies. The self-oscillating class-D amplifier according to the invention facilitates the switching of the switching frequency (self-oscillation frequency) according to the reception frequency even in a self-oscillating class-D amplifier. FIG. 20 shows an example configuration of a tuner-incorporated class-D amplifier in which the self-oscillating class-D amplifier according to the invention is provided with an auto-tuning AM tuner. A clock oscillator 86 generates a reference clock signal having a prescribed frequency. This reference clock signal is supplied to a tuner control microcomputer 88 and used as an operation clock there. The reference clock signal is also supplied to an AM tuner unit 90. The AM tuner unit 90 generates a local oscillation signal having an optional frequency using a PLL frequency synthesizer by frequency-dividing the reference frequency signal according to an instruction from the tuner control microcomputer 88. A reception frequency is determined by the frequency of the local oscillation signal. A frequency division circuit 92 generates reference frequency signals $f_a$ and $f_b$ having two respective (high and low) frequencies by frequency-dividing the reference clock signal. A switch 94 selects one of the reference frequency signals $f_a$ and $f_b$ according to an instruction from the tuner control microcomputer 88, and supplies the selected reference frequency signal to a self-oscillating class-D amplifier 96 according to the invention. The self-oscillating class-D amplifier 96 receives an analog signal demodulated by the AM tuner unit 90, class-D-amplifies it with a class-D amplification unit 98, and extracts an audio signal with the lowpass filter 30. The output audio signal is supplied to a speaker. And the class-D amplifier 96 receives the reference frequency signal selected by the switch 94, compares the phases of the reference frequency signal and a self-oscillation PWM signal that is output from the class-D amplification unit 98 with the phase comparator 26, averages a phase comparison output with the loop filter 28, and supplies a resulting signal to the class-D amplification unit 98. The self-oscillation frequency and phase of the class-D amplification unit 98 are controlled in this manner, whereby the self-oscillation PWM signal is frequency/phase-locked with the reference frequency signal. The tuner control microcomputer 88 selects one of the reference frequency signals $f_a$ and $f_b$ according to the reception frequency and supplies it to the class-D amplifier 96 so that the switching frequency and its harmonic frequencies are not included in a frequency range around the reception frequency.

Figure 21:
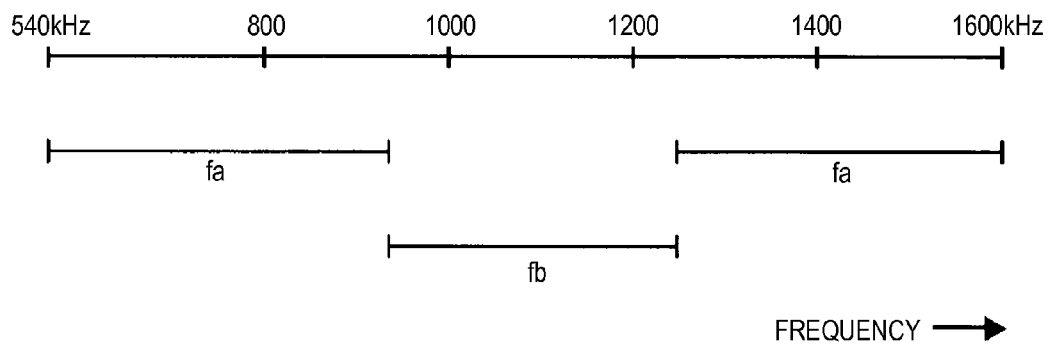
FIG. 21 is a diagram showing an example of how to switch between reference frequency signals $f_a$ and $f_b$ according to the reception frequency range in the amplifier of FIG. 20.

FIG. 21 shows an example of how the tuner control microcomputer 88 switches between the reference frequency signals $f_a$ and $f_b$ according to the reception frequency range. In this example, the reference frequency signal switching is made in the following manner:

540 to 900 kHz: $f_a$
900 to 1,200 kHz: $f_b$
1,200 to 1,600 kHz: $f_a$

Although in FIG. 20 the frequency control loop is a frequency/phase-locked loop, in this application example the frequency control loop may be one without a phase locking control because the self-oscillation frequency need not be in strict coincidence with the frequency of the reference frequency signal $f_a$ or $f_b$.

Although in each of the above embodiments the invention is applied to an audio class-D amplifier, the invention can also be applied to non-audio class-D amplifiers.

The present application is based on Japanese Patent Application No. 2011-242040 filed on Nov. 4, 2011 and No. 2012-239612 filed on Oct. 30, 2012, the disclosures of which are incorporated herein by reference.

INDUSTRIAL APPLICABILITY

The invention can provide a self-oscillating class-D amplifier and a self-oscillating frequency control method of a self-oscillating class-D amplifier which make it possible to stabilize a self-oscillation frequency. Furthermore, the invention is useful when applied to, for example, class-D audio amplifiers which are combined with an auto-tuning AM tuner.

DESCRIPTION OF SYMBOLS

13 . . . Self-oscillation loop
14 . . . Variable delay element (self-oscillation frequency varying element)
26 . . . Phase comparator
28 . . . Loop filter
33 . . . Frequency/phase-locked loop (frequency control loop)
32 . . . Logic inverter circuit
66 . . . Variable delay element/feedback circuit
68 . . . Integration circuit
72 . . . Hysteresis comparator (self-oscillation frequency varying element)
73 . . . Frequency control loop without phase locking control
$V_h$ . . . Reference voltage of hysteresis comparator

The invention claimed is:

1. A self-oscillating class-D amplifier comprising:
a self-oscillation frequency varying element which is placed in a self-oscillation loop of the self-oscillating class-D amplifier and varies a self-oscillation frequency of the self-oscillation loop, the self-oscillation loop receiving an input signal; and
a frequency control loop which:
extracts a self-oscillation signal of the self-oscillating class-D amplifier or a signal corresponding to the self-oscillation signal,
performs frequency comparison, cycle comparison, or phase comparison between the extracted signal and a reference frequency signal having a prescribed reference frequency, wherein the reference frequency signal is independent of the input signal to the self-oscillation loop, and
controls the self-oscillation frequency varying element in accordance with a result of the comparison and thereby performs a control of causing a frequency of the self-oscillation signal or the signal corresponding to the self-oscillation signal to follow the reference frequency.

2. The self-oscillating class-D amplifier according to claim 1, wherein the frequency control loop is a frequency/phase-locked loop which locks the extracted signal with the reference frequency signal in frequency and phase.

3. The self-oscillating class-D amplifier according to claim 1, wherein the frequency control loop is a frequency control loop without a phase locking control.

4. A self-oscillating class-D amplifier comprising:
a self-oscillation frequency varying element which is placed in a self-oscillation loop of the self-oscillating class-D amplifier and varies a self-oscillation frequency of the self-oscillation loop, the self-oscillation loop receiving an input signal;

a reference frequency signal generator which generates a reference frequency signal that is independent of the input signal to the self-oscillation loop; and a frequency control loop which:
- extracts information corresponding to a frequency or a cycle of a self-oscillation signal of the self-oscillating class-D amplifier or a signal corresponding to the self-oscillation signal from the self-oscillation signal or the signal corresponding to the self-oscillation signal,
- compares the extracted information with information corresponding to a prescribed reference frequency or reference cycle of the reference frequency signal, and
- controls the self-oscillation frequency varying element in accordance with a result of the comparison, and thereby performs a control of causing a frequency of the self-oscillation signal or the signal corresponding to the self-oscillation signal to follow the reference frequency.

5. The self-oscillating class-D amplifier according to claim 1, wherein the self-oscillating class-D amplifier is of such a type as to oscillate in a self-excited manner through positive feedback with phase rotation of a feedback signal of the self-oscillation loop;
- wherein the self-oscillation frequency varying element is a variable delay element placed in the self-oscillation loop; and
- wherein the frequency control loop controls a delay time of the self-oscillation frequency varying element in accordance with the result of the comparison and thereby performs the control of causing the frequency of the self-oscillation signal or the signal corresponding to the self-oscillation signal to follow the reference frequency.

6. The self-oscillating class-D amplifier according to claim 1, wherein the self-oscillating class-D amplifier is of such a type as to comprise an integration circuit which performs integration on an analog input signal and a feedback signal of the self-oscillation loop and a hysteresis comparator which receives an output signal of the integration circuit and outputs a binary signal, and to oscillate in a self-excited manner;
- wherein the self-oscillation frequency varying element is the hysteresis comparator; and
- wherein the frequency control loop controls a reference voltage of the hysteresis comparator in accordance with the result of the comparison and thereby performs the control of causing the frequency of the self-oscillation signal or the signal corresponding to the self-oscillation signal to follow the reference frequency.

7. A self-oscillating frequency control method of a self-oscillating class-D amplifier for controlling a self-oscillation frequency of a self-oscillating class-D amplifier, comprising:
- varying a self-oscillation frequency of a self-oscillation loop for a self-oscillation frequency element, which is placed in the self-oscillation loop of the self-oscillating class-D amplifier the self-oscillation loop receiving an input signal;
- extracting a self-oscillation signal of the self-oscillating class-D amplifier or a signal corresponding to the self-oscillation signal;
- performing frequency comparison, cycle comparison, or phase comparison between the extracted signal and a reference frequency signal having a prescribed reference frequency, wherein the reference frequency signal is independent of the input signal to the self-oscillation loop; and
- controlling the self-oscillation frequency varying element in accordance with a result of the comparison and thereby performing a control of causing a frequency of the self-oscillation signal or the signal corresponding to the self-oscillation signal to follow the reference frequency.

8. A self-oscillating frequency control method of a self-oscillating class-D amplifier for controlling a self-oscillation frequency of a self-oscillating class-D amplifier, comprising:
- varying a self-oscillation frequency of a self-oscillation loop for a self-oscillation frequency varying element, which is placed in the self-oscillation loop of the self-oscillating class-D amplifier, the self-oscillation loop receiving an input signal;
- generating a reference frequency signal that is independent of the input signal to the self-oscillation loop;
- extracting information corresponding to a frequency or a cycle of a self-oscillation signal of the self-oscillating class-D amplifier or a signal corresponding to the self-oscillation signal from the self-oscillation signal or the signal corresponding to the self-oscillation signal;
- comparing the extracted information with information corresponding to a prescribed reference frequency or reference cycle of the reference frequency signal; and
- controlling the self-oscillation frequency varying element in accordance with a result of the comparison and thereby performing a control of causing a frequency of the self-oscillation signal or the signal corresponding to the self-oscillation signal to follow the reference frequency.

9. The self-oscillating class-D amplifier according to claim 4, wherein the self-oscillating class-D amplifier is of such a type as to oscillate in a self-excited manner through positive feedback with phase rotation of a feedback signal of the self-oscillation loop;
- wherein the self-oscillation frequency varying element is a variable delay element placed in the self-oscillation loop; and
- wherein the frequency control loop controls a delay time of the self-oscillation frequency varying element in accordance with the result of the comparison and thereby performs the control of causing the frequency of the self-oscillation signal or the signal corresponding to the self-oscillation signal to follow the reference frequency.

10. The self-oscillating class-D amplifier according to claim 4, wherein the self-oscillating class-D amplifier is of such a type as to comprise an integration circuit which performs integration on an analog input signal and a feedback signal of the self-oscillation loop and a hysteresis comparator which receives an output signal of the integration circuit and outputs a binary signal, and to oscillate in a self-excited manner;
- wherein the self-oscillation frequency varying element is the hysteresis comparator; and
- wherein the frequency control loop controls a reference voltage of the hysteresis comparator in accordance with the result of the comparison and thereby performs the control of causing the frequency of the self-oscillation signal or the signal corresponding to the self-oscillation signal to follow the reference frequency.

\* \* \* \* \*